United States Patent [19]
Saito et al.

[11] Patent Number: 5,949,701
[45] Date of Patent: Sep. 7, 1999

[54] MEMORY CIRCUIT WITH A CONNECTION LAYOUT AND A METHOD FOR TESTING AND A WIRING DESIGN APPARATUS

[75] Inventors: Yoshiyuki Saito, Hirakata; Takahiro Watanabe, Hirakata, both of Japan

[73] Assignee: Matsushita Electric Industrial Co., Ltd., Osaka, Japan

[21] Appl. No.: 08/889,615

[22] Filed: Jul. 8, 1997

[30] Foreign Application Priority Data

Jul. 9, 1996 [JP] Japan ................................ 8-179668

[51] Int. Cl.⁶ ....................................................... G11C 5/06
[52] U.S. Cl. ........................ 365/63; 365/201; 365/189.03
[58] Field of Search ..................... 365/185.04, 189.02, 365/154, 63, 201, 189.03

[56] References Cited

U.S. PATENT DOCUMENTS 5,561,628  10/1996  Terada et al. .................... 365/185.04

FOREIGN PATENT DOCUMENTS 513662  1/1993  Japan .

OTHER PUBLICATIONS

"IEEE Standard Test Access Port and Boundary–Scan Architecture," IEEE St 1149. 1–1990.

*Primary Examiner*—David Nelms
*Assistant Examiner*—Thong Le
*Attorney, Agent, or Firm*—Price Gess & Ubell

[57] ABSTRACT

A memory circuit is equipped with a first integrated circuit including a first set of terminals which are connected to a bus and a second integrated circuit including a second set of terminals which are connected to the bus. The signal lines, which one-to one connect the terminals in the first set of terminals to the terminals in the second set of terminals, are arranged so that no pair of signal lines connected to adjacent terminals in the first set of terminals is connected to an adjacent pair or terminals in the second set of terminals.

13 Claims, 15 Drawing Sheets

FIG. 12A
PRIOR ART

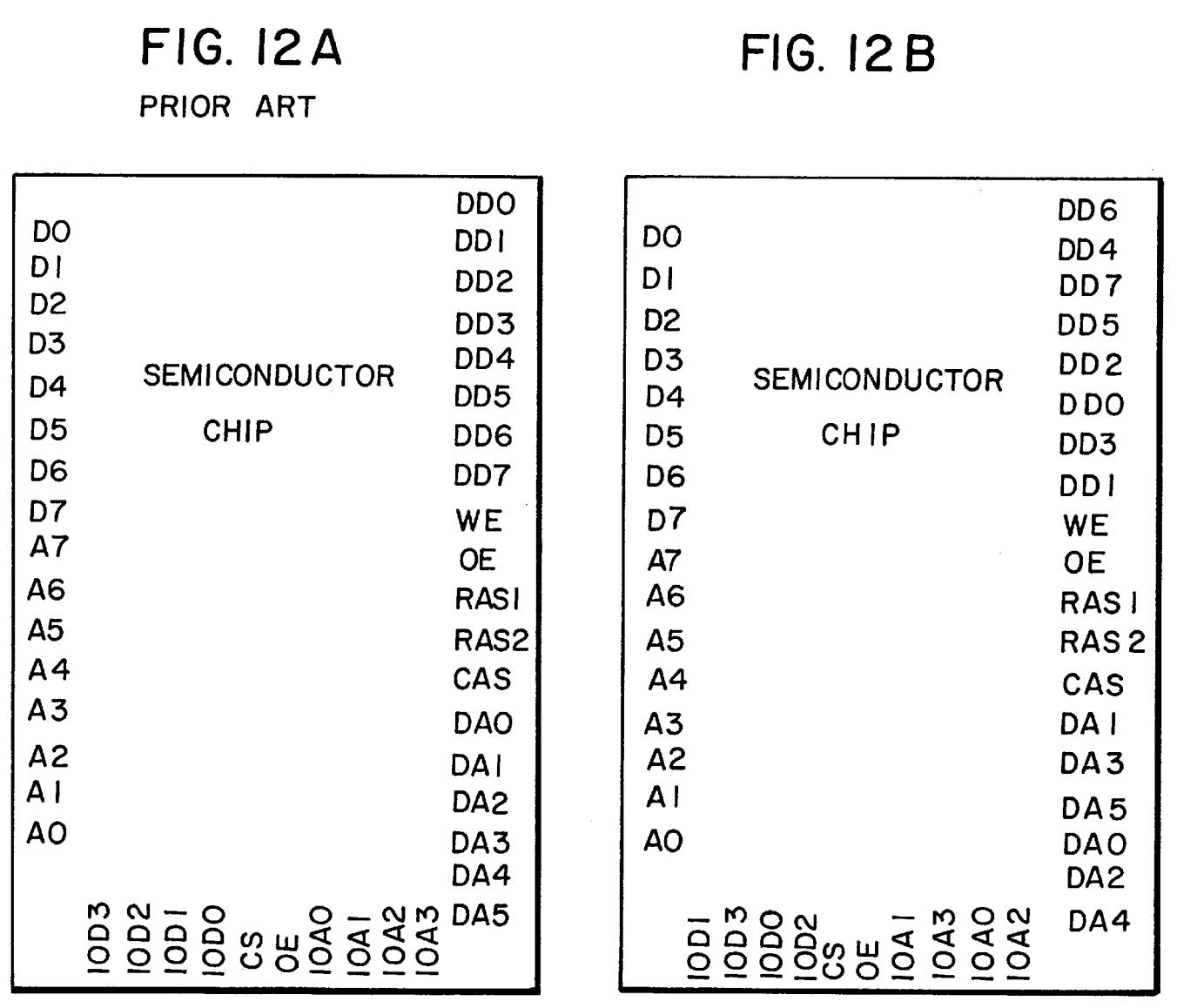

SEMICONDUCTOR CHIP

Left side pins (top to bottom): D0, D1, D2, D3, D4, D5, D6, D7, A7, A6, A5, A4, A3, A2, A1, A0

Top side pins (left to right): DD0, DD1, DD2, DD3, DD4, DD5, DD6, DD7, WE, OE, RAS1, RAS2, CAS, DA0, DA1, DA2, DA3, DA4, DA5

Right side pins (top to bottom): IOA3, IOA2, IOA1, IOA0, OE, CS, IOD0, IOD1, IOD2, IOD3

FIG. 12B

SEMICONDUCTOR CHIP

Left side pins (top to bottom): D0, D1, D2, D3, D4, D5, D6, D7, A7, A6, A5, A4, A3, A2, A1, A0

Top side pins (left to right): DD6, DD4, DD7, DD5, DD2, DD0, DD3, DD1, WE, OE, RAS1, RAS2, CAS, DA1, DA3, DA5, DA0, DA2, DA4

Right side pins (top to bottom): IOA2, IOA0, IOA3, IOA1, OE, CS, IOD2, IOD0, IOD3, IOD1

1

MEMORY CIRCUIT WITH A CONNECTION LAYOUT AND A METHOD FOR TESTING AND A WIRING DESIGN APPARATUS

BACKGROUND OF THE INVENTION

1. Field of the Invention

The present invention relates to a memory circuit which has a connection layout that is well suited to installation tests, a method for performing such installation tests, a wiring design apparatus for a memory circuit, and a memory control apparatus.

2. Related Art

In recent years, semiconductor chips with increasingly larger numbers of pins and with an increasingly narrower pin pitch are being mounted onto the printed circuit boards and multi-chip modules (hereinafter, MCMs) used in electronic appliances. This has led to difficulties in ensuring the correct mounting of such chips and the need to test whether such chips have been correctly mounted. The MCMs referred to here have a plurality of semiconductor chips mounted onto a board, known as a carrier substrate, upon which the wiring between the chips is formed, so that the entire MCM operates as if it were a single semiconductor chip.

As electronic appliances have become smaller, reductions in the size and increases in density have been achieved for the printed circuit boards provided in electrical appliances, resulting in a lack of free space on printed circuit boards and an inability to use conventional testing methods that require the provision of a special terminal used for testing.

Boundary-scan testing (hereinafter referred to as "BS") has been standardized according to IEEE Std. 1149.1-1990 as one method of testing the connections of an MCM or printed circuit board. FIG. 1A shows a circuit which has been adapted to BS. In this figure, IC1 and IC2 each have eight terminals. Numerals 91a–91d inside each IC are the various BS registers (hereinafter referred to as BSRs). BSRs 91a–91c handle the input and output of data into each of the corresponding terminals, in addition to forming a shift register that is serially connected by the BS bus 92. This shift register handles the input and output of serial data.

With the above construction, the connection is tested by having values set in the BSR via serial input outputted by the terminals, having a serial output of BSR values which were inputted via the terminals, and then comparing the output values of these input values.

As shown by the example of FIG. 1A, a test value (1111) is set in BSR91b of IC1 by serial input from the BS bus 92, and is then outputted by terminals connected to IC2. By doing so, the terminal output from IC1 is inputted into BSR91c from the terminals of IC2 via signal lines, and serial output is performed from BSR 91c using BS bus 92. After this, the serially outputted value is compared with the original test value and the connection between IC1 and IC2 is evaluated. If the output value matches the test value, the connection is considered normal.

Using BS in this way, the connection between semiconductor chips can be tested without requiring the provision of a large number of special terminals to be used for testing.

When BS is used, however, while it is possible to detect that a problem has occurred with the connection between semiconductor chips, it is not possible to know in which semiconductor chip the problem is located.

As one example, FIG. 1B shows the case when a short circuit has occurred between signal lines SIG1 and SIG2 which connect IC1 and IC2. As a result, the value sampled by IC2 will become (0010) or (1110), so that while the presence of a problem can be detected by BS, it is not possible to specify which of IC1 and IC2 has the terminal where the short circuit has occurred.

As a result, when problems with a connection are detected by BS, it is not possible to specify the broken part of the connection, so that it is necessary to go to the further trouble of performing more detailed tests, or to replace all of the semiconductor chips which could possibly include the defective part of the connection. In such a case, there is a large decrease in the efficiency of testing, and semiconductor chips which are unrelated to the problem can end up being replaced, leading to an increase in the cost of reinstallation and in the cost of the semiconductor chips used.

SUMMARY OF THE INVENTION

In view of the stated problems, it is a first object of the present invention to provide a memory circuit, a testing method for the memory circuit, a wiring design apparatus, and a memory control apparatus, any of which can facilitate tests for short circuits between terminals in a printed circuit board.

This object can be achieved by a memory circuit equipped with a first integrated circuit including a first set of terminals which are connected to a bus and a second integrated circuit including a second set of terminals which are connected to the bus, characterized by having signal lines, which one-to-one connect the terminals in the first set of terminals to the terminals in the second set of terminals, arranged so that no pair of signal lines connected to adjacent terminals in the first set of terminals is connected to an adjacent pair or terminals in the second set of terminals.

With the above construction, when a short circuit occurs between the terminals in any of the sets of terminals, the present invention can easily detect the IC and the set of terminals where the short circuit is located.

Here, each of the sets of terminals may be one of a set of terminals connected to a data bus and a set of terminals connected to an address bus, with the first integrated circuit being a memory controller for controlling memory access and the second integrated circuit being a memory chip.

With the above construction, short circuits can quickly be located for a bus between a memory controller and a memory chip.

Here, a set of terminals connected to a data bus may be classified into groups which each include a plurality of terminals, with the signal lines being arranged to connect terminals in corresponding groups out of the sets of terminals.

With the stated construction, there are the further effects that tests in group units can be performed, as well as tests for a plurality of groups which are performed in parallel.

The above object can also be achieved by a memory circuit including a plurality of integrated circuits which are each equipped with at least one of set of address terminals and a set of data terminals, characterized in that at least one of a set of signal lines, which form an address bus connecting sets of address terminals, and a set of signal lines, which form a data bus connecting sets of data terminals, is arranged so that no pair of signal lines connecting two adjacent terminals in any set of terminals is connected to adjacent terminals in another set of terminals.

With the stated construction, even when there are multiple integrated circuits, it is easy to specify the integrated circuit when the short circuit is located.

Here, the above stated object can also be achieved by a method for testing a memory circuit for a short circuit between terminals, the memory circuit being a memory circuit which includes a plurality of integrated circuits that are each equipped with at least one of set of address terminals and a set of data terminals, with at least one of a set of signal lines, which form an address bus connecting sets of address terminals, and a set of signal lines, which form a data bus connecting sets of data terminals, being arranged so that no pair of signal lines connecting two adjacent terminals in any set of terminals is connected to adjacent terminals in another set of terminals, the method including: a selecting step for selecting one bit out of the address bus as a tested bit; a generating step for generating a first address which sets a logical value of the tested bit at 0 or 1, and a logical value of all remaining bits in the address bus at an inverse value to the logical value of the tested bit; a first writing step for writing predetermined data into an address where each bit is set at the inverse value to the logical value of the tested bit; and a second writing step for writing data, which differs from the predetermined data, into the first address; a reading step for reading data from the address where each bit is set at the inverse value to the logical value of the tested bit; a comparing step for comparing the data read in the reading step with the predetermined data; a determining step for determining that a short circuit has occurred between a terminal corresponding to the tested bit and an adjacent terminal when the data compared in the comparing step does not match, and for determining that no short circuit has occurred when the data compared in the comparing step matches; and a reexecuting step for selecting a new bit, out of bits in the address bus which are yet to be tested, as the tested bit, and for having the generating step reexecuted.

With the stated method, not only can connection problems with the set of terminals of the address bus be detected, but the chip whose terminals are the cause of the problem can also be identified.

Here, the above stated object can be achieved by a method for testing a memory circuit for a short circuit between terminals, the memory circuit being a memory circuit equipped with a first integrated circuit including a first set of terminals that are connected to a bus and a second integrated circuit including a second set of terminals which are connected to the bus, characterized by having signal lines, which one-to one connect the terminals in the first set of terminals to the terminals in the second set of terminals, arranged so that no pair of signal lines connected to adjacent terminals in the first set of terminals is connected to an adjacent pair or terminals in the second set of terminals, each of the sets of terminals being a set of terminals connected to a data bus, the first integrated circuit being a memory controller for controlling memory access, and the second integrated circuit being a memory chip, a set of terminals connected to a data bus being classified into groups which each include a plurality of terminals, and the signal lines being arranged to connect terminals in corresponding groups out of the sets of terminals, the method including: a selecting step for selecting one bit in each group of the data bus as a tested bit; a generating step for generating data where each tested bit is set at zero and remaining bits are set at one; a writing step for writing the data generated in the generating step into a first address: a comparing step for reading data from the first address and comparing the read data with the data generated in the generating step; a determining step for determining that a short circuit has occurred between terminals when the data compared in the comparing step does not match; and a reexecuting step for selecting, after the determining step, a new bit in each group, out of bits in the data bus which are yet to be tested, as the tested bit, and for having processing from the generating step to the determining step reexecuted.

With the stated method, not only can connection problems with the set of terminals of the data bus be detected, but the chip whose terminals are the cause of the problem can also be specified.

The wiring design apparatus for achieving the stated object is a wiring design apparatus for wiring a printed circuit board which includes memory chips and a memory control chip for receiving memory access requests from a CPU (Central Processing Unit) and for controlling memory access to the memory chips, the wiring design apparatus including: an obtaining unit for obtaining circuit diagram information showing a circuit which includes the memory chips and the memory control chip; a first extracting unit for extracting, from the obtained circuit diagram information, the memory control chip and any rewritable memory chips as components; a second extracting unit for extracting, from the obtained circuit diagram information, terminal positions and terminal interconnections for groups of terminals, in the components extracted by the first extracting unit, which are connected to a bus; a changing unit for changing the terminal interconnections extracted by the second extracting unit so that no signal lines that are connected to adjacent terminals out of a set of terminals belonging to a component extracted by the first extracting unit are connected to adjacent signal lines in any other component; and a wiring unit for wiring the printed circuit board based on the changed terminal interconnections.

With the stated construction, circuits can be adapted to become better suited to testing by rearranging the signal lines between a memory control chip and rewritable memory chips, so that when a short circuit occurs, the present invention can soon specify whether the short circuit is located at the terminals of the memory control chip, at the terminals of a memory chip, or at the terminals of one out of a plurality of memory chips.

Here, the changing unit may include: a table for storing a plurality of sets of interchanging data which is data for changing terminal interconnections so that signal lines connected to any two adjacent terminals of a first component are not connected to adjacent terminals in another component; and a changing unit for referring to the table and changing the terminal interconnections between the first component and the other component.

With the above construction, wiring which is suited to installation tests can be achieved by a simple construction which changes the wiring based on information given in a table.

The memory control circuit for achieving the stated object is a memory control circuit which is provided as a single chip, which receives memory access requests from a CPU, and controls memory access to a memory chip, the memory control circuit being characterized by including a first set of terminals which supplies an address to the memory chip and a second set of terminals which perform data input and output with the memory chip, and by having the terminals in the first and second sets of terminals arranged so that a difference in CPU bit numbers between terminals in each adjacent pair of terminals in the first and second sets of terminals is not less than two.

With the above memory control circuit, a memory control circuit which is suited to installation tests can be achieved without changing the wiring of a printed circuit board after the wiring has first been designed by a conventional printed circuit board CAD system.

Here, each of the first and second sets of terminals may be classified into groups which each include a plurality of terminals, and wherein the terminals in every group in the sets of terminals are arranged so that a difference in CPU bit numbers between adjacent terminals is not less than two.

With the above memory control circuit, it is also possible to perform tests in units of groups and to perform tests for a plurality of groups simultaneously.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 12A shows the terminal positions of a conventional semiconductor chip;

FIG. 12B shows a semiconductor chip, produced by the semiconductor producing apparatus, whose terminals have been positioned by a terminal position deciding apparatus.

DESCRIPTION OF THE PREFERRED EMBODIMENTS

First Embodiment

Figure 1A:
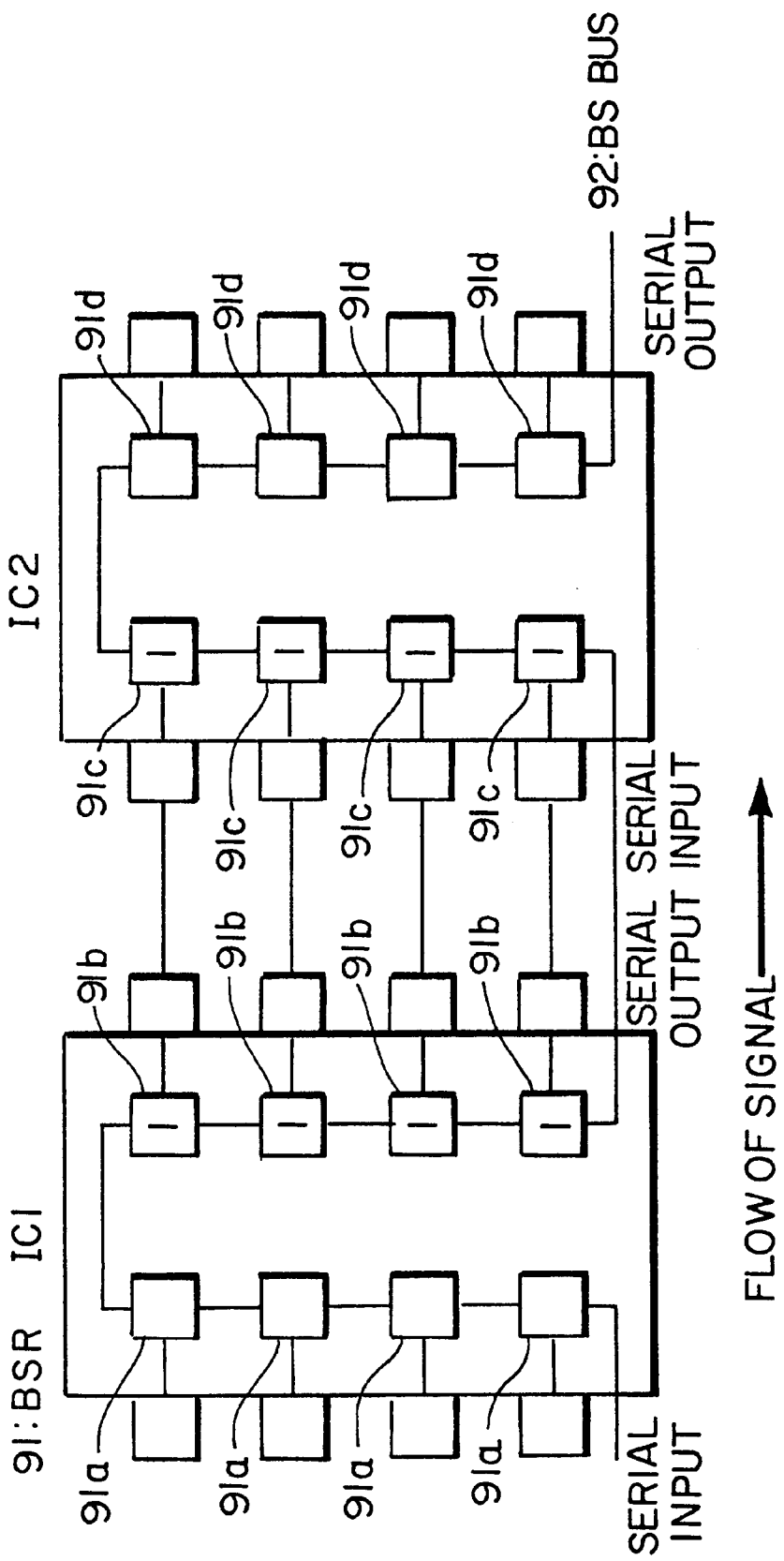
FIG. 1 shows the conventional boundary-scan testing method.
Figure 1B:
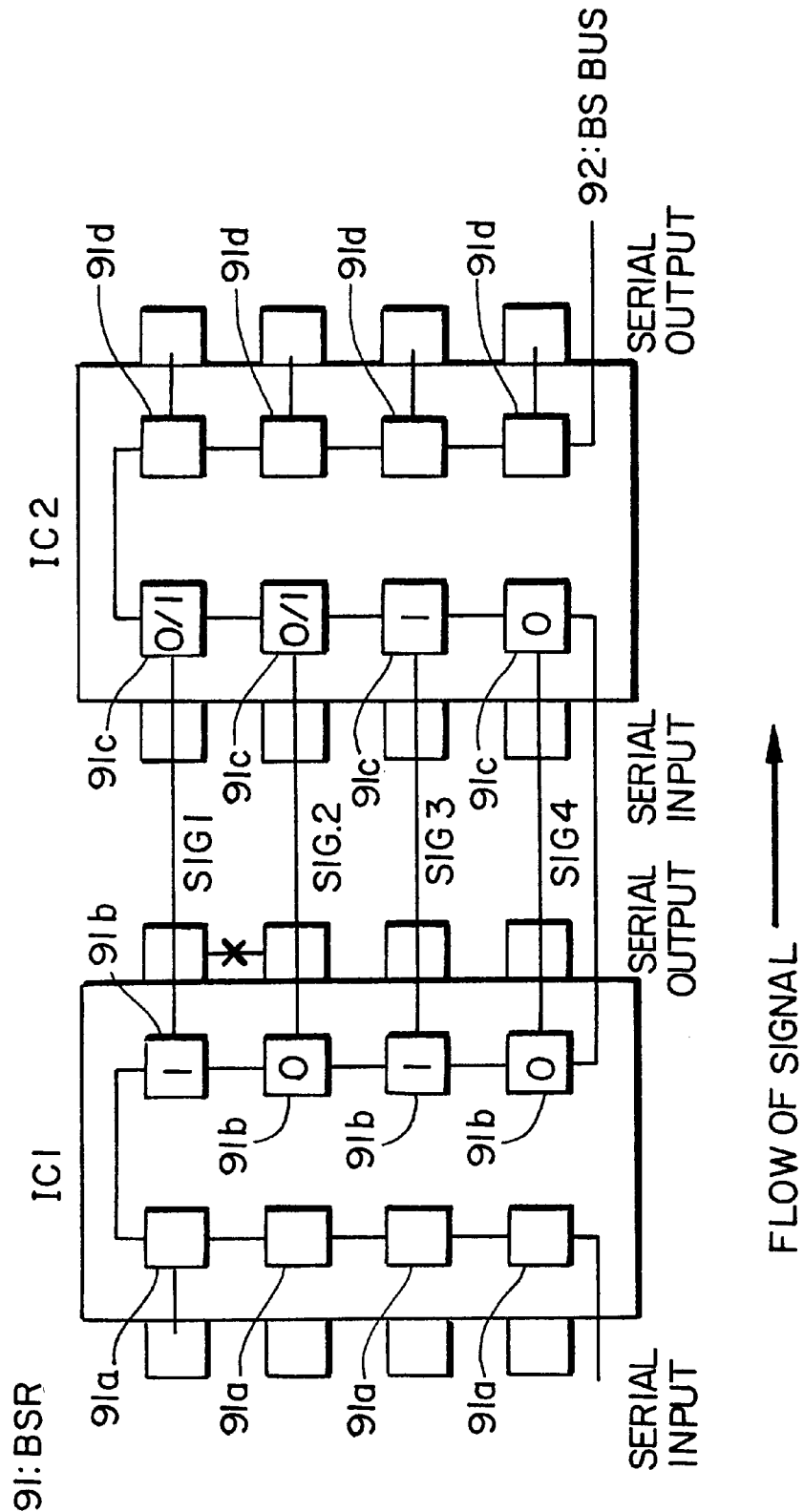
Figure 2:
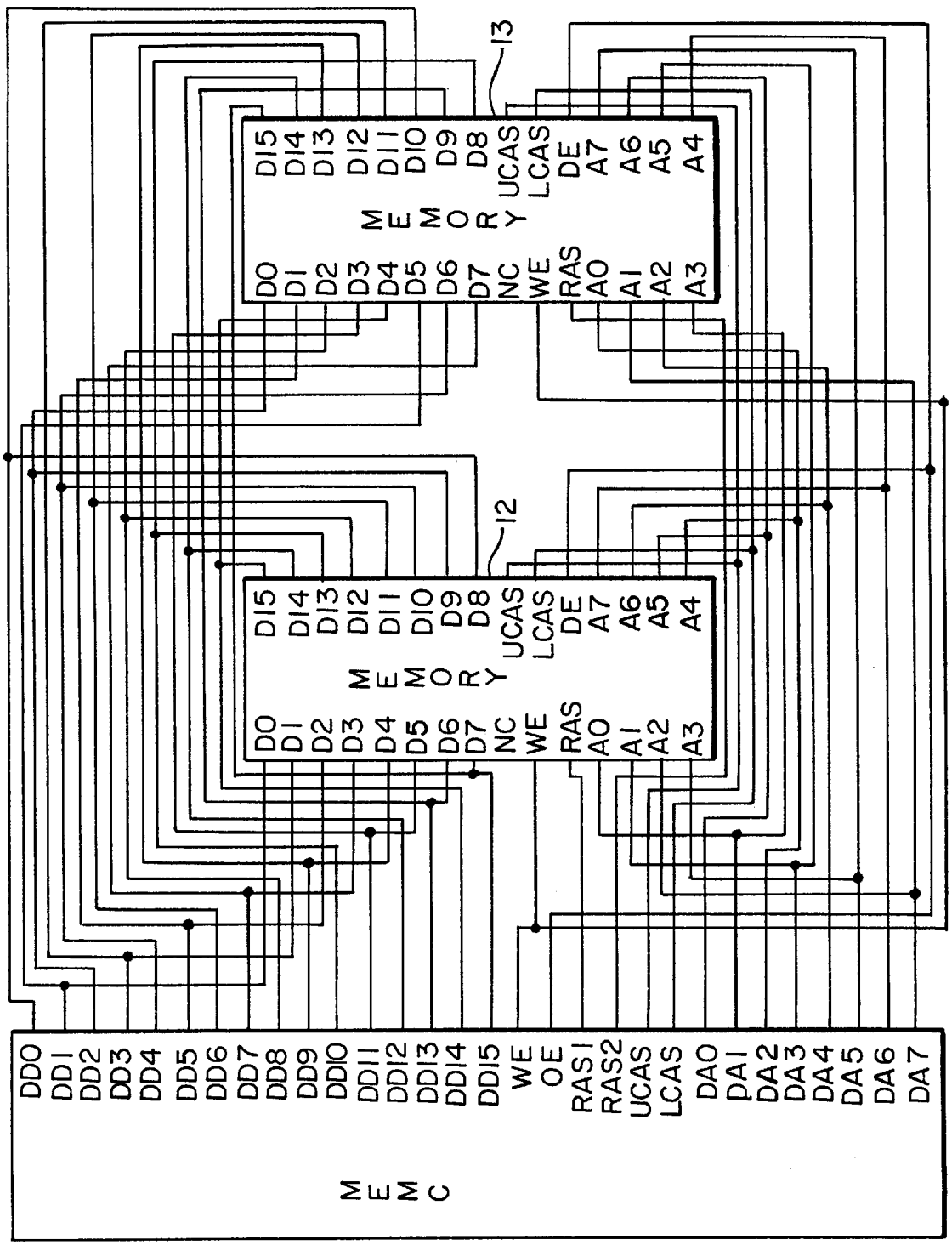
FIG. 2 shows the memory circuit of the first embodiment of the present invention.

FIG. 2 shows the memory circuit of the first embodiment of the present invention. This memory circuit is composed of a memory controller 11 (hereinafter referred to as "MEMC 11"), and memories 12, 13, with a plurality of wires interconnecting these components. A circuit diagram of these wires is also shown in FIG. 2, with these wires being formed on the printed circuit board on which the components 11–13 are mounted. Here, it is preferable for each of the components 11–13 to be an FP (flat package) single chip LSI (Large Scale Integrated Circuit) which has been designed for mounting on a board. The logical arrangement of the terminals of each of these components is as shown in FIG. 2. Note however, that the power supply terminal and ground terminal of each of components 11–13 are not illustrated in the present figure.

MEMC 11 is a single chip memory controller which controls memory access to memories 12, 13 in accordance with memory access requests from a CPU which is not illustrated. This MEMC 11 may be realized using a commercially available memory controller. This MEMC 11 has a set of data terminals [15:0] for inputting and outputting data to and from memories 12, 13, a set of address terminals [7:0] for outputting addresses to memories 12, 13, and a plurality of control terminals (WE, OE, RAS1, RAS2, UCAS, LCAS). Here, the notation "[15:0]" represents sixteen bits from bit 15 to bit 0. This MEMC 11 is also equipped with other components, such as a CPUIF (CPU interface) for inputting and outputting memory access requests to and from the CPU, but since only the memory IF has a direct connection to the present invention, these other components will not be explained.

Memories 12, 13 are both composed of standard DRAM, and each include a set of address input terminals A [7:0], a set of data input terminals [15:0], as well as a plurality of control terminals (WE, OE, RAS1, RAS2, UCAS, LCAS).

The wires in the circuit one-to-one connect the sets of address terminals and one-to-one connect the sets of data terminals. This connection setup does, however, have a special characteristic. This characteristic is that in any of the sets of terminals for the various components, the wires connected to a pair of adjacent terminals in one component are not connected to adjacent terminals in any of the other components.

Table 1 is a connection table for the wires (lines) connecting the sets of data terminals and the sets of address terminals in FIG. 2.

TABLE 1

| signal name | MEMC11 terminal | memory 12 terminal | memory 13 terminal |
|---|---|---|---|
| ADDRESS | | | |
| DA0 | DA0 | A5 | A6 |
| DA1 | DA1 | A0 | A3 |
| DA2 | DA2 | A4 | A0 |
| DA3 | DA3 | A6 | A5 |
| DA4 | DA4 | A6 | A2 |
| DA5 | DA5 | A3 | A7 |
| DA6 | DA6 | A7 | A4 |
| DA7 | DA7 | A2 | A1 |
| DATA | | | |
| DD0 | DD0 | D8 | D10 |
| DD1 | DD1 | D0 | D5 |
| DD2 | DD2 | D9 | D0 |
| DD3 | DD3 | D1 | D11 |
| DD4 | DD4 | D10 | D6 |
| DD5 | DD5 | D2 | D1 |
| DD6 | DD6 | D11 | D12 |
| DD7 | DD7 | D3 | D7 |
| DD8 | DD8 | D12 | D2 |

TABLE 1-continued

| signal name | MEMC11 terminal | memory 12 terminal | memory 13 terminal |
| --- | --- | --- | --- |
| DD9 | DD9 | D4 | D13 |
| DD10 | DD10 | D13 | D8 |
| DD11 | DD11 | D5 | D3 |
| DD12 | DD12 | D14 | D14 |
| DD13 | DD13 | D6 | D9 |
| DD14 | DD14 | D15 | D4 |
| DD15 | DD15 | D7 | D15 |

Table 1 shows the signals which flow through each of the lines together with the terminals in the MEMC 11 and in memories 12 and 13 which are connected by each of the signal lines. The signal name DA[7:0] represents a column address and row address which are outputted by the MEMC 11 to the memories 12 and 13 using time division. The signal name DD[15:0] represents sixteen-bit data. From this Table 1, it can be seen that the signal lines connected to any pair of adjacent terminals in any component (such as DA0 and DA1 in MEMC 11) are connected to non-adjacent terminals in the other components (in this example, A5 and A0 in memory 12, and A6 and A3 in memory 13). This is true for all pairs of adjacent terminals in all of the components.

The following is a description of the test procedure for the memory circuit of the present embodiment described above. It should be noted here that the memory read and memory write in the following explanation are memory access requests outputted by a CPU (not illustrated) in executing a test program, with these memory access requests being executed by the MEMC 11.

The following explanation will assume that a short circuit has occurred between the terminals D3 and D4 of memory 12 shown in FIG. 2 due to defective soldering. In this case, when differing logical values are outputted by the signals DD7 and DD9, this will result in the logical values of both DD7 and DD9 erroneously becoming either 0 or 1. This erroneous result will be 0 or 1 depending on the electrical characteristics, such as the driving capacity of the circuit elements. In the following explanation, an erroneous output resulting in both signals becoming 0 will be called an "AND"-type short circuit, while an erroneous output resulting in both signals becoming 1 will be called an "OR"-type short circuit. The characteristics of the present circuit are such that the above short circuit is an AND-type short circuit.

In the above case, when the data "0xFF7F" (where 0x represents hexadecimal, and only bit DD7 is 0) is written into an address in the memories 12, 13 and then read from the same address, a short circuit will occur between DD7 and DD9, so that read data will become "0xFD7F" (where bits DD7 and DD9 are 0).

In the above case, it can clearly be seen from the result 0xFD7F that a short circuit has occurred between DD7 and DD9, since the value of DD9 would be 1 if the circuit were functioning normally. From Table 1, it can be seen that the pairs of terminals connected to signal lines DD7 and DD9 are DD7 and DD9 in MEMC 11, D3 and D4 in memory 12, and D7 and D13 in memory 13. Here, the component where these terminals are adjacent (and which therefore could be prone to short circuits) is memory 12, so that it can easily be determined that the short circuit is located within memory 12.

The above example supposes that an erroneous "0" results from a short circuit between a "1" and a "0" ("AND-type short circuit"), although when such short circuit results in an erroneous "1" ("OR-type short circuit"), if the test data is reversed (i.e., set at "0x0080"), the chip where the short circuit is located can be found using the same process.

It should be noted here that the present invention is not limited to the connection pattern shown by Table 1. However, the connection pattern used should satisfy the condition that the signal lines connected to any two adjacent terminals on any component are not connected to adjacent terminals in any other component.

Second Embodiment

Figure 3:
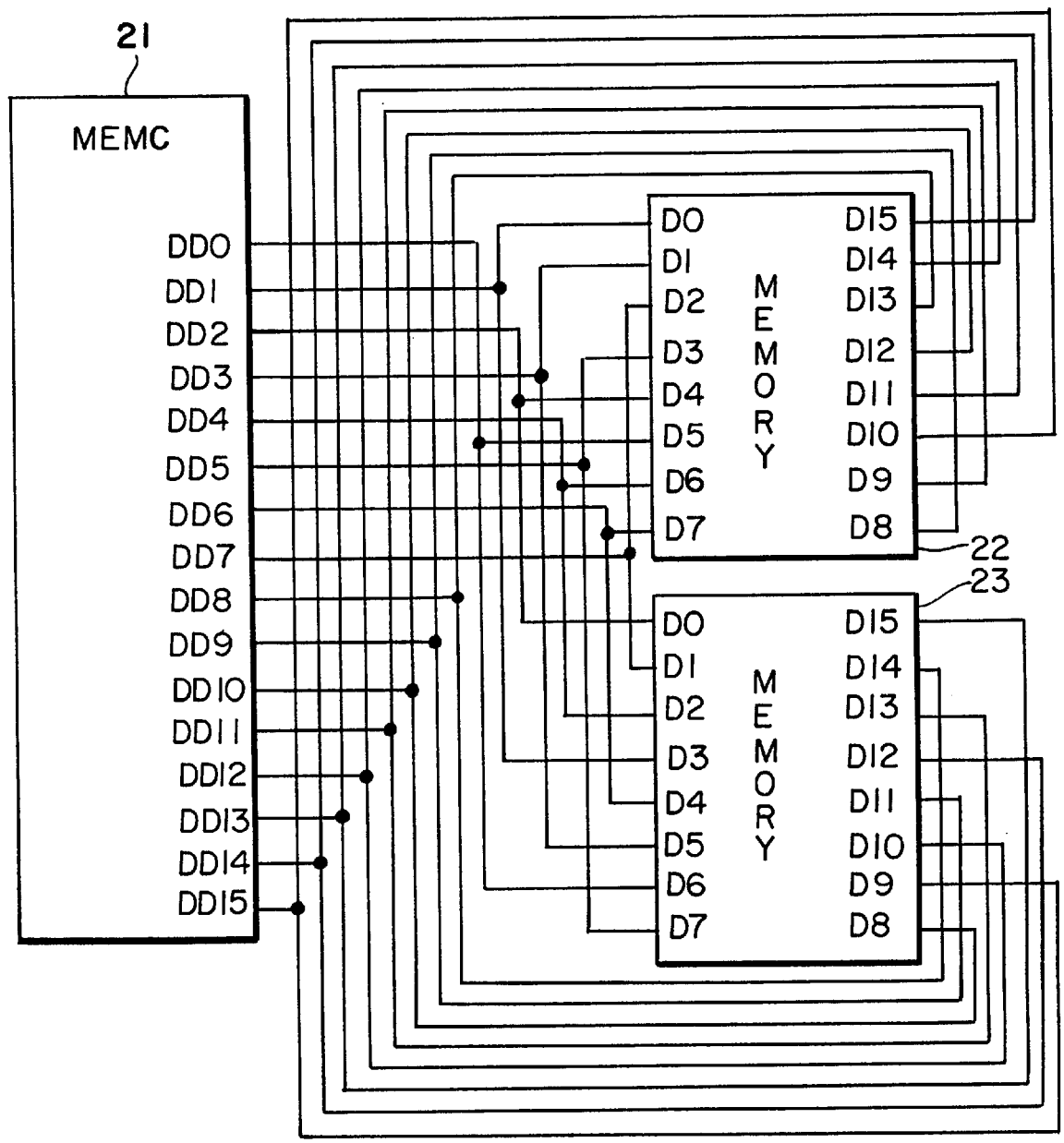
FIG. 3 shows the memory circuit of the second embodiment of the present invention.

FIG. 3 shows the memory circuit in the second embodiment of the present invention. This memory circuit is composed of MEMC 21 and memories 22, 23, with these components being interconnected by a plurality of wires. Components with the same names as FIG. 2 are the same as the first embodiment. The present embodiment, however, will only describe the sets of data terminals in each component and data bus.

The connection pattern of the sets of data terminals shown in FIG. 3 is given by Table 2.

TABLE 2

| signal name | MEMC terminal | memory 22 terminal | memory 23 terminal |
| --- | --- | --- | --- |
| DATA | | | |
| DD0 | DD0 | D5 | D6 |
| DD1 | DD1 | D0 | D3 |
| DD2 | DD2 | D4 | D0 |
| DD3 | DD3 | D1 | D5 |
| DD4 | DD4 | D6 | D2 |
| DD5 | DD5 | D3 | D7 |
| DD6 | DD6 | D7 | D4 |
| DD7 | DD7 | D2 | D1 |
| DD8 | DD8 | D13 | D14 |
| DD9 | DD9 | D8 | D11 |
| DD10 | DD10 | D12 | D8 |
| DD11 | DD11 | D9 | D13 |
| DD12 | DD12 | D14 | D10 |
| DD13 | DD13 | D11 | D15 |
| DD14 | DD14 | D15 | D12 |
| DD15 | DD15 | D10 | D9 |

Table 2, like Table 1, shows a connection pattern where no two adjacent terminals in any component are connected to adjacent terminals in any other component. As one example, adjacent terminals DD0 and DD1 in MEMC 11 are connected to non-adjacent terminals D5 and D0 in memory 12, and to non-adjacent terminals D6 and D3 in memory 13. In Table 2, the sets of data terminals are classified into several groups each comprising several terminals, with terminals in one of these groups being connected to terminals in a corresponding group in another component. In this example, the set of data terminals DD[15:0] in MEMC 21 is classified into a DD[15:8] group and a DD[7:0] group, with the sets of data terminals DD[15:0] in memory 22 and memory 23 being similarly classified into a DD[15:8] group and a DD[7:0] group.

The following is a description of the test procedure for the memory circuit of the present embodiment described above. Here, the procedure during the test to see in which component a short circuit between terminals is located is the same as in the first embodiment, so that no further explanation will be given.

The difference with the first embodiment lies in the ability to perform separate tests to see in which of the groups of data terminals in the memory circuit the short circuit is located. This division into sets of eight bits is used since the smallest number of bits for which memory access is performed by a standard CPU (such as Intel's 80486 or Pentium processors) is eight bits.

It should be noted that the number of bits in each group need not be limited to eight bits, so that other values such as four bits are possible. Eight bits, however, is the preferred size for the groups.

Third Embodiment

Figure 4:
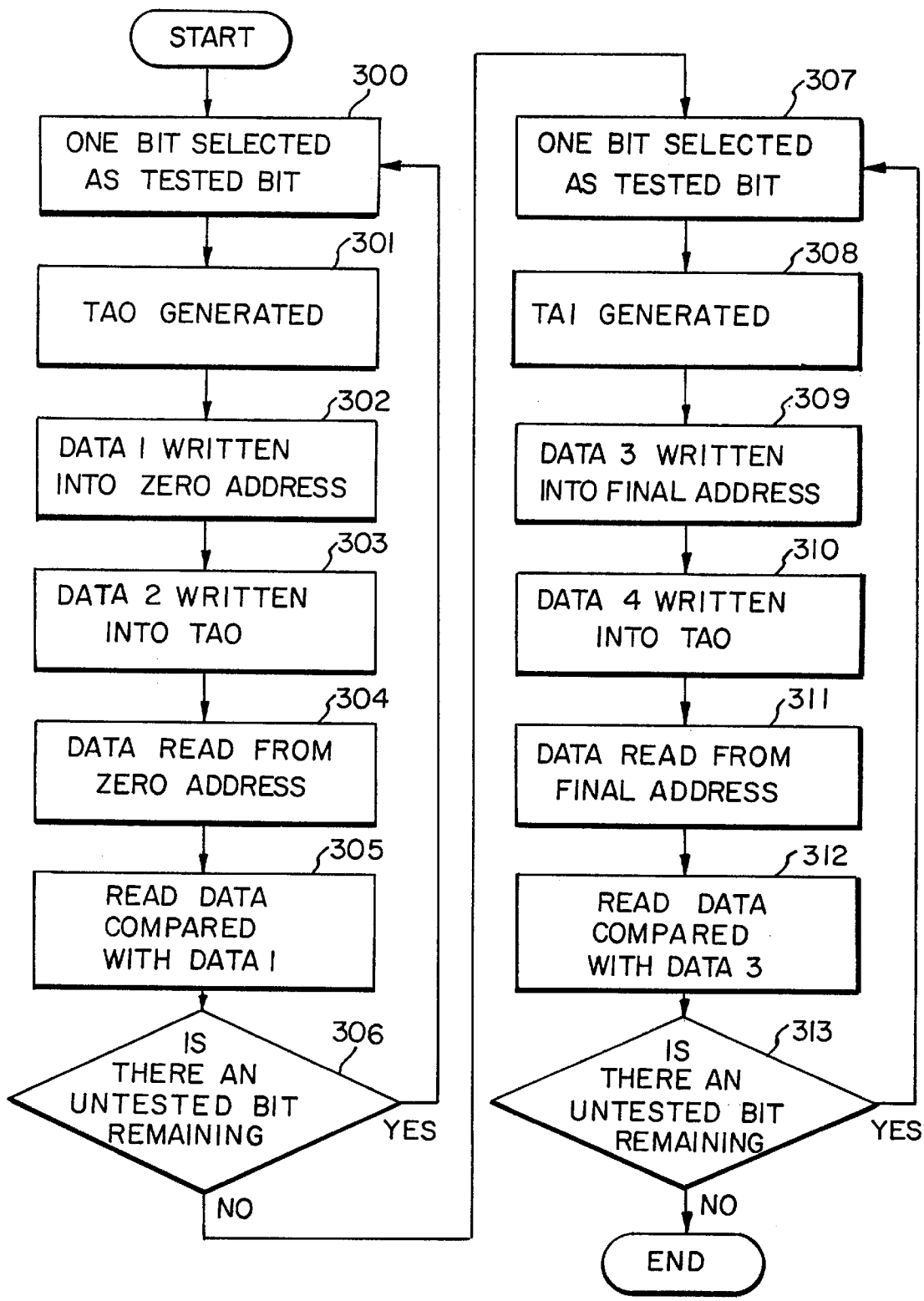
FIG. 4 is a flowchart for the memory connection testing method for the address bus according to the third embodiment of the present invention.
Figure 5:
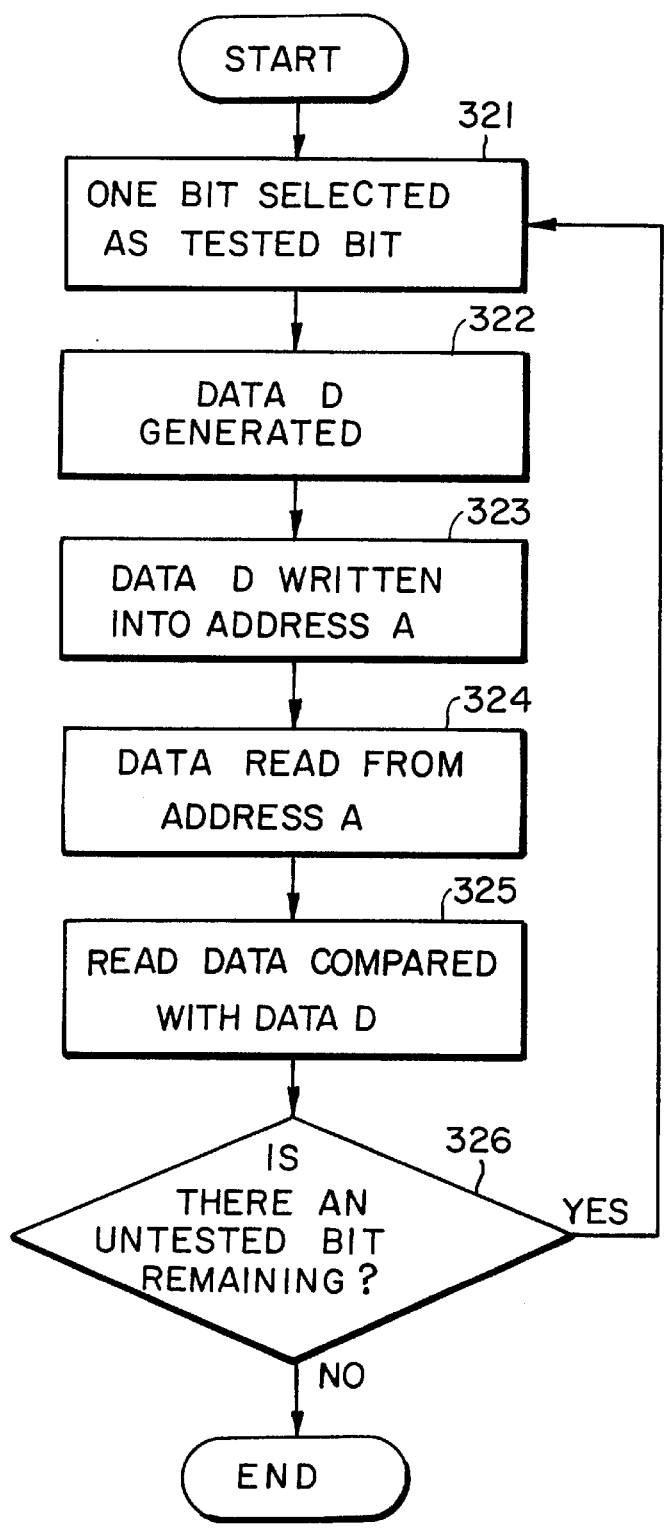
FIG. 5 is a flowchart for the memory connection testing method for the data bus according to the third embodiment of the present invention.

FIGS. 4 and 5 are flowcharts for the memory connection testing procedure in the third embodiment of the present invention. This memory connection testing procedure is used to test the memory circuit of the first embodiment which was shown in FIG. 2. The flowcharts in FIGS. 4 and 5 are realized by having a CPU (not illustrated), which executes a testing program for the present testing procedure, connected to the MEMC 11, or by having a testing program embedded inside the MEMC 11. The testing program referred to here includes a testing data table and test result table, and is stored in a ROM or RAM which is mapped onto different address area to memory 12 and 13, or in an internal register (not illustrated) of the MEMC 11.

The flowchart in FIG. 4 shows the testing procedure for the connection of the address bus. The former half of this flowchart (steps 300–306) is the procedure for detecting an AND-type short circuit and the latter half (steps 307–313) is the procedure for detecting an OR-type short circuit. The testing data table used in this procedure is shown below as Table 3.

TABLE 3

| data 1 | 0x0000 |
| data 2 | 0xFFFF |
| data 3 | 0x0000 |
| data 4 | 0xFFFF |

| tested bit | TA0 | TA1 |
| --- | --- | --- |
| DA0 | 00000001 | 11111110 |
| DA1 | 00000010 | 11111101 |
| DA2 | 00000100 | 11111011 |
| DA3 | 00001000 | 11110111 |
| DA4 | 00010000 | 11101111 |
| DA5 | 00100000 | 11011111 |
| DA6 | 01000000 | 10111111 |
| DA7 | 10000000 | 01111111 |

As shown in the testing data table of Table 3, each of the sixteen bits in data 1–4 is stored in target address 0 (shown in Table 3 as TA0) and in target address 1 (shown in Table 3 as TA1) of the address bus DA[15:0]. In Table 3, data 1–4 are expressed in hexadecimal, while TA0 and TA1 are expressed in binary. Here, data 1, data 2, and TA0 are used in the former half of FIG. 4, while data 3, data 4, and TA1 are used in the latter half. These addresses given as TA0 show the addresses which become the base (zero) address when the respective tested bit flips to zero, while the addresses given as TA1 show the addresses which become the final address when the respective tested bit flips to 1. Here, the values of data 1 and data 2 only need to be different, although it is desirable for their respective values to be all zero bits and all one bits, as is used in the present embodiment. This is also the case for data 3 and data 4.

As shown in FIG. 4, the CPU selects the tested bit and generates TA0 based on the testing data table (steps 300, 301), before writing data 1 (0x0000) into the zero address (step 302) and data 2 (0xFFFF) into the TA0 address (step 303). When doing so, if there is a short circuit for the tested bit, data 2 is overwritten into the zero address without being written into the TA0 address (when the circuit characteristics are such that AND-type short circuits occur).

The CPU reads the data in the zero address, compares it with data 1 in the testing data table (step 304), and stores "1" in the result table when the data matches or "0" when the data does not match. When there is no short circuit, "0x0000" will be read from the zero address, while when there is a short circuit, "0xFFFF" will be read from the zero address. Accordingly, if the system is operating normally, the comparison results in a match, while when there is a problem with the connection, the comparison will not result in a match, showing that there is a short circuit for the test bit.

The CPU then performs the processes in steps 300 to 305 for the remaining bits to be tested (step 306). By doing so, it is possible to detect short circuits for the address bus when the characteristics of the memory circuit are such that AND-type short circuits occur.

After this, the CPU performs the same testing procedure as above using data 3, data 4, and TA1 (steps 307 to 312). When doing so, this testing is based on circuit characteristics (short circuits being OR-type short circuits) in that a write operation into TA1 will result in the data in the final address being overwritten.

The flowchart in FIG. 5 shows the testing procedure for the connection of the data bus. This procedure uses the testing data table shown in Table 4.

TABLE 4

| Address A | 0x0000 |
| --- | --- |
| Tested bit | Data D |
| DD0 | 1111111111111110 |
| DD1 | 1111111111111101 |
| DD2 | 1111111111111011 |
| DD3 | 1111111111110111 |
| DD4 | 1111111111101111 |
| DD5 | 1111111111011111 |
| DD6 | 1111111110111111 |
| DD7 | 1111111101111111 |
| DD8 | 1111111011111111 |
| DD9 | 1111110111111111 |
| DD10 | 1111101111111111 |
| DD11 | 1111011111111111 |
| DD12 | 1110111111111111 |
| DD13 | 1101111111111111 |
| DD14 | 1011111111111111 |
| DD15 | 0111111111111111 |

This data table is composed of an arbitrary addresses A and the data D for each tested bit. Here, any address may be used for address A, but it is preferable for an address entirely composed of zeros (i.e., 0x00) to be used, as is shown in the present embodiment.

As shown in FIG. 5, the CPU selects the tested bit and generates the data D for the selected tested bit, based on the testing data table (steps 321, 322). It then writes this data D into the address given as address A (0x00) (step 323), and reads the data from address A (step 324). In doing so, when there is a short circuit for the tested bit, when a write operation is performed into the address A, the tested bit will switch to 1 (when the circuit characteristics are such that OR-type short circuits occur), or the bit whose terminal is adjacent to the tested bit will switch to 0 (when the circuit characteristics are such that AND-type short circuits occur).

After this, the CPU compares the data read from address A with the data D in the testing data table (step 325), and stores "1" in the result table when the data matches or "0" when the data does not match.

The CPU then repeats the procedure in steps 321 to 325 with the remaining bits as tested bits (according to step 326), so that short circuits in the data bus can be detected when the memory circuit has characteristics such that AND-type errors and OR-type errors occur.

The following is a description of the memory connection testing method of this third embodiment which will be divided into (1) Test for the address bus when connection is normal, (2) Test for the address bus when there is an AND-type short circuit, (3) Test for the address bus when there is an OR-type short circuit, (4) Test for the data bus when connection is normal, and (5) Test for the data bus when there is a short circuit.

(1) Test for the Address Bus when Connection is Normal

The following is an explanation of the testing procedure for the connection of the address bus in the memory circuit of FIG. 2, in accordance with the flow of FIG. 4. In this example, there are no short circuits between terminals.

First, the tested bit is set at DA0, data 1 (0x0000) is written into the zero address, and data 2 is written into TA0 (address 0x01) (steps 300 to 303). Following this, the CPU checks whether the data written from the zero address is the same as data 1 (steps 304, 305). Where there is no short circuit for the tested bit zero address, the data at the zero address will not have been overwritten, so that the comparison result will be a match. In this case, the value "1", showing that the test result for tested bit DA0 is a match, is written into the test result table. The above procedure is then performed for the tested bits DA1 to DA15. By doing so, all of the tested bits can be tested for AND-type errors.

Following this, the tested bit is set at DA0, data 3 (0x0000) is written into the final address (address 0xFF), and data 4 (0xFFFF) is written into TA1 (address 0xFE) (steps 307 to 310). The data read from the final address is then compared with data 3, and the comparison result for the present tested bit is stored in the testing result table (step 311, 312). When there is no short circuit for the tested bit DA0, the final address will not have been overwritten, so that the comparison will result in a match. The above testing procedure is then performed for the tested bits DA1 to DA15. By doing so, all of the tested bits can be checked for OR-type errors. The test result table used in this case is shown as Table 5.

TABLE 5

| Tested bit | | Comparison Result |
|---|---|---|
| DA0 | TA0 | 1 |
|  | TA1 | 1 |
| DA1 | TA0 | 1 |
|  | TA1 | 1 |
| DA2 | TA0 | 1 |
|  | TA1 | 1 |
| DA3 | TA0 | 1 |
|  | TA1 | 1 |
| DA4 | TA0 | 1 |
|  | TA1 | 1 |
| DA5 | TA0 | 1 |
|  | TA1 | 1 |
| DA6 | TA0 | 1 |
|  | TA1 | 1 |
| DA7 | TA0 | 1 |
|  | TA1 | 1 |

This Table 5 stores the test results for the AND-type error checking (TA0) and the test results for OR-type checking (TA1) for each of the tested bits. As shown in the above table, all of the comparison results will be 1 when the circuit is functioning normally.

(2) Test for the Address Bus when there is an AND-type Short Circuit

The following explanation deals with the case when a short circuit has occurred between DA0 and DA2 in the memory circuit of FIG. 2. With the exception of these tested bits DA0 and DA2, all of the tested bits are judged in the above process as functioning normally, so that the following description will focus on the testing performed for DA0 and DA2.

In the processing in the former half of FIG. 4, when the tested bit is DA0, data 1 (0x0000) is written into address 0, and data 2 (0xFFFF) is written into TA0 (address 0x01) (steps 300 to 303). When writing into TA0, the TA0 (0x01 address) is switched into the (0x00 address) due to the AND-type short circuit between DA0 and DA2, so that the zero address is overwritten with data 2 (0xFFFF). After this, data read from the zero address (in this case 0xFFFF) is compared with data 1 (0x0000) to see whether they match (steps 304, 305). As a result, "0" is also written into the test result table showing that the comparison did not result in a match for the tested bit DA0. Here, "0" is written into the test result table showing that the comparison did not result in a match for the tested bit DA2. In this way, the existence of an error for DA0 and DA2 is detected in the former half of FIG. 4.

In the latter half of FIG. 4, data 3 (0x0000) is written into the final address (address 0xFF), and data 4 (0xFFFF) is written into TA1 (address 0xFE) (steps 307 to 310). Here, when writing into TA1, the AND-type short circuit between DA0 and DA2 results in a switching of the writing address to 0xFA, so that the writing operation is mistakenly performed into 0xFA. However, since the data at the final address (address 0XFF) is not overwritten, the data read from the final address will be 0x0000 (step 311). In this case, the read data (0x0000) will match data 3 (0x0000), so that the comparison result will be "1" (step 312). This will also be the case when DA2 is selected as the tested bit. Accordingly, AND-type short circuits are not detected in the latter half of the processing shown in FIG. 4.

Table 6 shows the test result table after the processing described above.

TABLE 6

| Tested bit | | Comparison Result |
|---|---|---|
| DA0 | TA0 | 0 |
|  | TA1 | 1 |
| DA1 | TA0 | 1 |
|  | TA1 | 1 |
| DA2 | TA0 | 0 |
|  | TA1 | 1 |
| DA3 | TA0 | 1 |
|  | TA1 | 1 |
| : | : | all "1" |
| DA7 | TA0 | 1 |
|  | TA1 | 1 |

As can be seen from the above table, the test results in the TA0 line for tested bits DA0 and DA2 become "0". This shows that an AND-type short circuit has occurred for the signal lines DA0 and DA2. Here, it can be seen from Table 1 that memory 12 is the component where DA0 and DA2 are adjacent, so it can be seen that a short circuit has occurred between the A4 and A5 terminals of memory 12.

(3) Test for the Address Bus when there is an OR-type Short Circuit

The following explanation deals with the case when there is a short circuit between DA0 and DA2 in the memory circuit of FIG. 2 and the memory circuit has OR-type short circuit characteristics. Here, as described in section (1) above, all of the tested bits aside from DA0, DA2 are judged as working normally, so that the following description will only describe the testing of DA0 and DA2.

In the processing in the former half of FIG. 4, when the tested bit is DA0, data 1 (0x0000) is written into address 0, and data 2 (0xFFFF) is written into TA0 (address 0x01) (steps 300 to 303). When writing into TA0, address TA0 is switched into the (0x05 address) due to the OR-type short circuit between DA0 and DA2, so that the data in the 0x05 address is overwritten. However, since the data in the zero address is not overwritten, the data in the zero address remains at 0x0000 (step 304). Accordingly, when the data (0x0000) read from the zero address is compared with data 1 (0x0000), the result is a match, so that "1" is written into the test result table as the comparison result (step 305). This is also the case for tested bit DA2. As a result, OR-type short circuits cannot be detected by the processing in the former half of FIG. 4.

During the processing in the latter half of FIG. 4, when the tested bit is DA0, data 3 (0x0000) is written into the final address (address 0xFF), while data 4 (0xFFFF) is written into TA1 (address 0xFE) (steps 307 to 310). Here, when writing into TA1, the short circuit between DA0 and DA2 results in the address to be written into mistakenly becoming the final address (address 0xFF), so that the data in the final address is overwritten. The data read from this final address (address 0xFF) ends up as 0xFFFF (step 311), the comparison with data 3 (0x0000) does not result in a match, and "0" is written as the comparison result into the test result table (step 312). This is also the case when the tested bit DA2. The test result table after this processing is shown below as Table 7.

TABLE 7

| Tested bit | | Comparison Result |
|---|---|---|
| DA0 | TA0 | 1 |
|  | TA1 | 0 |
| DA1 | TA0 | 1 |
|  | TA1 | 1 |
| DA2 | TA0 | 1 |
|  | TA1 | 0 |
| DA3 | TA0 | 1 |
|  | TA1 | 1 |
| : | : | All "1" |
| DA7 | TA0 | 1 |
|  | TA1 | 1 |

As can be seen from the above table, the test results in the TA1 line for tested bits DA0 and DA2 become "0". These show that an OR-type short circuit has occurred for the signal lines DA0 and DA2. Here, it can be seen from Table 1 that memory 12 is the component where DA0 and DA2 are adjacent, so that a short circuit has occurred between the A4 and A5 terminals of memory 12.

As shown in (2) and (3) above, one of the test results TA0 or TA1 will become 0 (not matching) for tested bits where a short circuit of either AND-type or OR-type is located, which means that the short circuit can be detected. It can be seen from Table 1 that the semiconductor chip where DA0 and DA2 are connected to adjacent terminals is memory 12, so that it can be easily determined that a short circuit has occurred in memory 12.

In the following description, Table 8 and Table 9 show the test results of when the data bus shown in FIG. 2 is tested using the testing method of the present embodiment using the address A and the data D given in Table 4. Table 8 shows the results when the connection of the data bus is operating normally, while Table 9 shows the results when a short circuit has occurred between signals DD7 and DD9.

The following explanation will follow the processing given in FIG. 4.

(4) Test for the Data Bus when Connection is Normal

The following is an explanation of the procedure for testing the connection of the data bus in the memory circuit of FIG. 2, with reference to the flowchart in FIG. 5.

First, when the tested bit is DD0, data D (0xFFFE) is written into address A (address 0x00), before 0xFFFE is read from address (0x00) (step 321–324). Here, the read data (0xFFFE) matches data D (0xFFFE), so that the comparison result is set at 1 (match) and is written into the test result table for the current tested bit (step 325). This test procedure is then repeated for the remaining tested bits, so that the test result table becomes as shown in Table 8.

TABLE 8

| Tested bit | Comparison Result |
|---|---|
| DD0 | 1 |
| DD1 | 1 |
| DD2 | 1 |
| DD3 | 1 |
| DD4 | 1 |
| DD5 | 1 |
| DD6 | 1 |
| DD7 | 1 |
| DD8 | 1 |
| DD9 | 1 |
| DD10 | 1 |
| DD11 | 1 |
| DD12 | 1 |
| DD13 | 1 |
| DD14 | 1 |
| DD15 | 1 |

As shown in the above Table 8, the comparison result for all of the tested bits is 1.

(5) Test for the Data Bus when there is a Short Circuit

The following explanation deals with the case when there is a short circuit between DA7 and DA9 in the memory circuit of FIG. 2. Here, as described in section (4) above, all of the tested bits aside from DA7, DA9 are judged as working normally, so that the following description will only describe the testing of DA7 and DA9.

In the processing in FIG. 5, when the tested bit is DA7, data D (0xFF7F) is written into address A (address 0x00), before the data is read from address A (steps 321–324). When writing data D (0xFF7F) into address A, the short circuit between DD7 and DD9 results in the data which is actually written into address A (address 0x00) becoming either 0xFD7F or 0xFFFF. When the data 0xFD7F or 0xFFFF is read from address A (address 0x00), this will not match data D (0xFF7F), giving a comparison result of "0" (step 325). This comparison result "0" is then written into the test result table as the test result for tested bit DD7. This is also the case when DD9 is selected as the tested bit, so that the test result "0" is also written into the test result table for tested bit DD9. After this processing, the test result table becomes as shown in Table 9.

TABLE 9

| Tested bit | Comparison Result |
|---|---|
| DD0 | 1 |
| : | : |
| DD6 | 1 |
| DD7 | 0 |
| DD8 | 1 |
| DD9 | 0 |
| DD10 | 1 |
| : | : |
| DD15 | 1 |

It can be seen from the above Table 9 that a problem has occurred with the tested bits DD7 and DD9. From Table 1, it can be seen that the component where DD7 and DD9 are adjacent is memory 12, so that it can clearly be seen that a short circuit has occurred between terminals D3 and D4 of memory 12.

Fourth Embodiment

The memory connection testing method of the present embodiment is used to test the memory circuit of the second embodiment which was shown in FIG. 2. This is to say, the tested memory circuit is such that the data bus of each component is split into a number of groups, with the signal lines connected to any two adjacent terminals in one group not being connected to adjacent terminals in a corresponding group in any other component.

Figure 6:
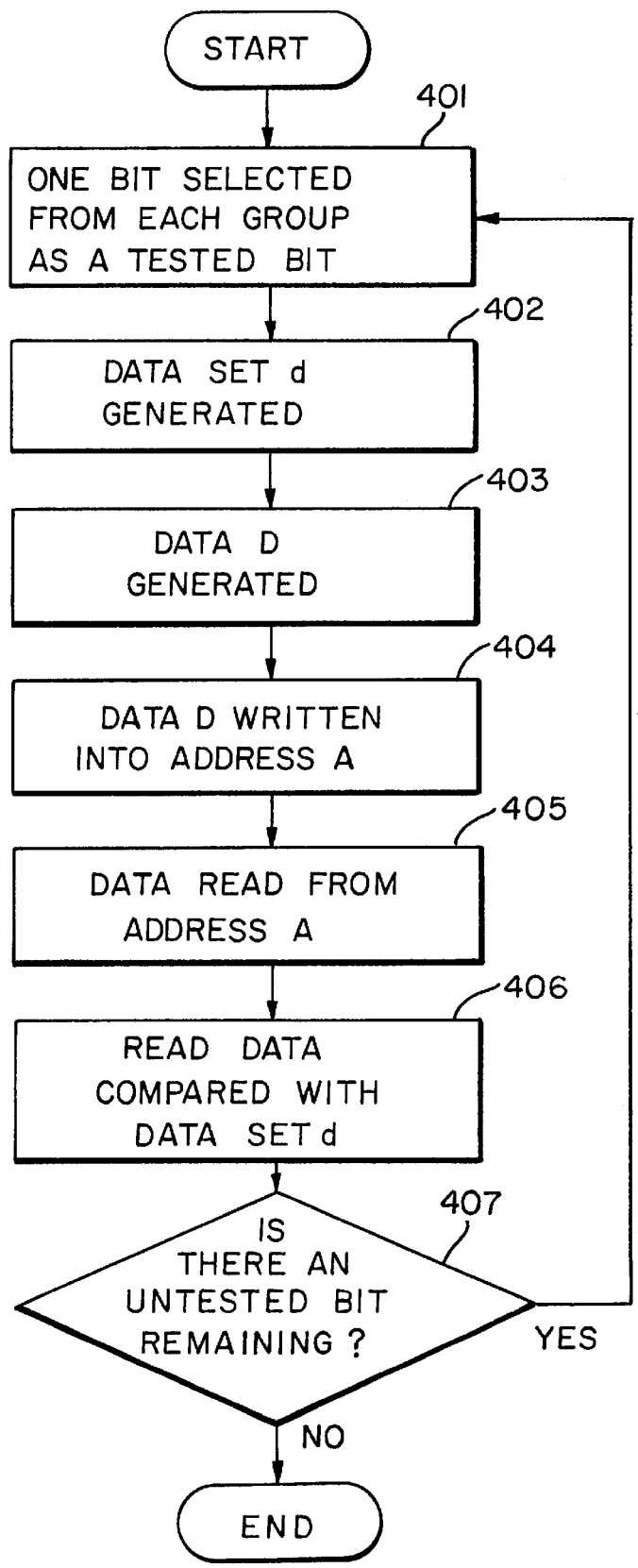
FIG. 6 is a flowchart for the memory connection testing method according to the fourth embodiment of the present invention.

FIG. 6 is a flowchart for the memory connection testing method of the present embodiment. This memory connection testing method is performed by having a CPU (not illustrated) connected to the MEMC 11 execute a test program which achieves the functions of the present embodiment, or by having a testing program provided inside the MEMC 11 itself. This testing program includes a testing data program and a test result table, and is stored in a ROM or RAM which is mapped a different address region to the memories 22 and 23, or in an internal register (also not illustrated) of the MEMC 11.

The testing data table used by this present memory connection testing method when testing the memory circuit shown in FIG. 3 is given as Table 10 below.

TABLE 10

| Address | 0x00 |
| --- | --- |
| Group 1 | DD[7:0] |
| Group 2 | DD[15:8] |

| Tested bit | | | |
| --- | --- | --- | --- |
| Group 1 | Group 2 | Data Set d | Data D |
| DD0 | DD8 | 11111110 | 1111111011111110 |
| DD1 | DD9 | 11111101 | 1111110111111101 |
| DD2 | DD10 | 11111011 | 1111101111111011 |
| DD3 | DD11 | 11110111 | 1111011111110111 |
| DD4 | DD12 | 11101111 | 1110111111101111 |
| DD5 | DD13 | 11011111 | 1101111111011111 |
| DD6 | DD14 | 10111111 | 1011111110111111 |
| DD7 | DD15 | 01111111 | 0111111101111111 |

In Table 10, address A is the address which is written and then read when checking the read and the write of the test data (data D). The value used as this address A is not important, although it is preferable that all zeros are used, as is the case shown in the present embodiment. Groups 1 and 2 are respectively the lower and higher 8 bits of the data bus of the memory circuit shown in FIG. 3. The tested bit shows the bit numbers of the bits in Groups 1 and 2 in ascending order. The data set d is made up of the test data for the tested bits in each group, with the same data being used for both groups. Data D shows the expanded test data of the data sets d for the entire groups so that a plurality of groups can be tested at the same time.

As shown in FIG. 6, the CPU selects the tested bit and generates the data set d and data D for this tested bit based on the testing data table (step 401–403), writes data D into the address A (address 0x00) (step 404), and then reads the data from address A (step 405). In doing so, if there is a short circuit for the tested bit, the tested bit will switch to 1 (when the circuit is prone to OR-type short circuits), or the bit for a terminal adjacent to the test bit will switch to 0 (when the circuit is prone to AND-type short circuits).

Following this, the CPU compares the read data with the data D in the table for both groups (step 406), and writes "1" into the test result table when the data matches, or "0" when the data does not match.

After this, the CPU repeats (as a result of step 407) the above procedure in steps 401 to 406 for the remaining tested bits and so is able to detect short circuits in the memory circuit of both AND-type and OR-type.

The following is an explanation of the procedure in the memory connection testing method of this fourth embodiment, with this explanation being divided into (1) testing the data bus when the connection is normal and (2) testing when there is a short circuit in the data bus.

(1) Testing the Data Bus when the Connection is Normal

First, when DD0 in Group 1 and DD8 in Group 2 are selected as the tested bits, 0xFE is generated as the data set d since DD0 in Group 1 and DD8 in Group 2 are the Least Significant Bits (LSB) in their respective groups, with 0xFEFE being generated as data D (steps 401 to 403). This data D is then written by the CPU into address A (address zero) and the data at address A (address zero) is read by the CPU (steps 404, 405). Here, since the connection is operating normally, the matching data 0xFEFE is read. Since the read data for both the groups, which is to say the lower 8 bits and the higher 8 bits or (Group 1:0xFE, Group 2:0xFE), matches data set d for each group (Group 1:0xFE, Group 2:0xFE), the comparison result for both Group 1 and Group 2 is "1" (step 406). By repeating the above procedure, testing is performed for all of the tested bits, with the comparison result for each group in the present example being "1". These test results are shown in Table 11.

TABLE 11

| Tested Bit | | Comparison Result | |
| --- | --- | --- | --- |
| Group 1 | Group 2 | Group 1 | Group 2 |
| DD0 | DD8 | 1 | 1 |
| DD1 | DD9 | 1 | 1 |
| DD2 | DD10 | 1 | 1 |
| DD3 | DD11 | 1 | 1 |
| DD4 | DD12 | 1 | 1 |
| DD5 | DD13 | 1 | 1 |
| DD6 | DD14 | 1 | 1 |
| DD7 | DD15 | 1 | 1 |

(2) Testing when there is a Short Circuit in the Data Bus

The following explanation assumes that a short circuit has occurred between DD0 and DD3 in the memory circuit of FIG. 3. Here, the results for the tested bits aside from DD0 and DD3 are the same as above, and so will be omitted. When DD0 from Group 1 and DD8 from Group 2 are selected as the tested bits, 0xFE is generated as the data set d and 0xFEFE is generated as data D, with data 0xFEF6 (0xFEFF) ending up being written in address A (address zero) due to the short circuit between DD0 and DD3. As a result, 0xFEF6 is the data read from address A (address zero), so that the comparison results when the values for each group (group 1:0xF6, group 2:0xFE) are compared with data D (group 1:0xFE, group 2:0xFE) are 0 and 1, respectively (steps 405, 406).

The comparison results when the tested bit is DD3 are also 0 for Group 1 and 1 for Group 2, so that the test results table becomes as shown by Table 12 below.

TABLE 12

| Tested Bit | | Comparison Result | |
| --- | --- | --- | --- |
| Group 1 | Group 2 | Group 1 | Group 2 |
| DD0 | DD8 | 0 | 1 |
| DD1 | DD9 | 1 | 1 |
| DD2 | DD10 | 1 | 1 |
| DD3 | DD11 | 0 | 1 |

TABLE 12-continued

| Tested Bit | | Comparison Result | |
|---|---|---|---|
| Group 1 | Group 2 | Group 1 | Group 2 |
| DD4 | DD12 | 1 | 1 |
| DD5 | DD13 | 1 | 1 |
| DD6 | DD14 | 1 | 1 |
| DD7 | DD15 | 1 | 1 |

As a result of the short circuit, the comparison results for Group 1 when DD0 and DD3 are the tested bit are 0 (not matching), so that it can be clearly seen that a short circuit has occurred between DD0 and DD3. From Table 2, it can be seen that memory 23 is the component where these signal lines are connected to adjacent terminals, meaning that the short circuit is located within the memory 23.

Fifth Embodiment

Figure 7:
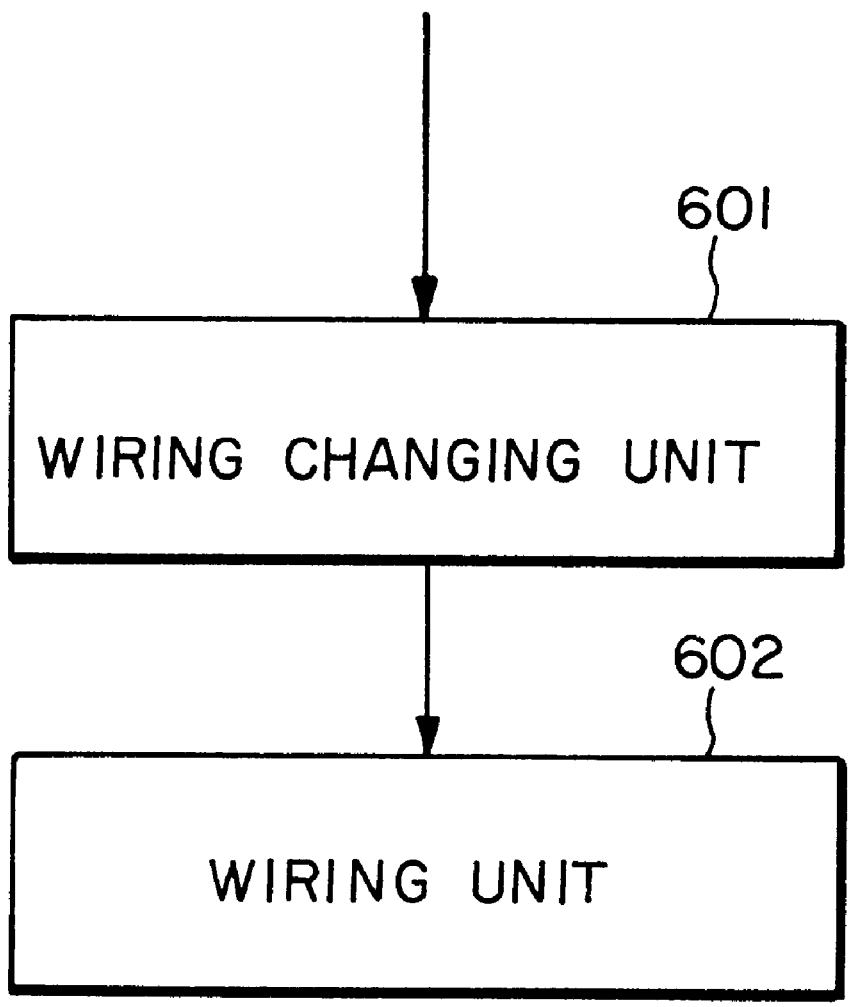
FIG. 7 is a block diagram showing the outline construction of the wiring design apparatus in the fifth embodiment of the present invention.

FIG. 7 is a block diagram showing a simplification of the construction of the wiring design apparatus of the fifth embodiment of the present invention. The wiring design apparatus is composed of wiring changing unit 601 and wiring unit 602, and is used for wiring a printed circuit board used in a memory circuit, such as that of the second embodiment shown in FIG. 3, that is to be provided with a wiring layout which is suited to installation tests. It should be noted here that the term "wiring" does not refer here to the installation of wires on the printed circuit board, but in fact refers to the setting and changing of information showing the signal lines, such as a bus, in a circuit diagram, or the setting of information showing the wiring on the printed circuit board.

The wiring changing unit 601 in FIG. 7 changes the wiring between the memory controller and the memory to wiring which is suited to installation tests, based on circuit diagram information obtained from conventional circuit diagram CAD (Computer Aided Design) system, and outputs the converted circuit diagram information. More specifically, the wiring changing unit 601 classifies the buses of each component into groups, with memory chips and the memory controller as the components in the circuit. The wiring changing unit 601 then changes the wiring so that no two signal lines which are connected to adjacent terminals in one of the components are connected to adjacent terminals in any of the other components.

The wiring unit 602 provides the wiring between the components on the printed circuit board, based on the converted circuit diagram information. This wiring unit 602 can be achieved by a conventional printed circuit CAD system.

This wiring design apparatus is composed by adding a wiring changing unit 601 to a printed circuit CAD system realized by a conventional workstation or the like. In this construction, the wiring changing unit 601 and the wiring unit 602 are realized by having programs which include the functions of the respective units executed by the CPU (hereinafter referred to as "CPU1") of a workstation.

Figure 9:
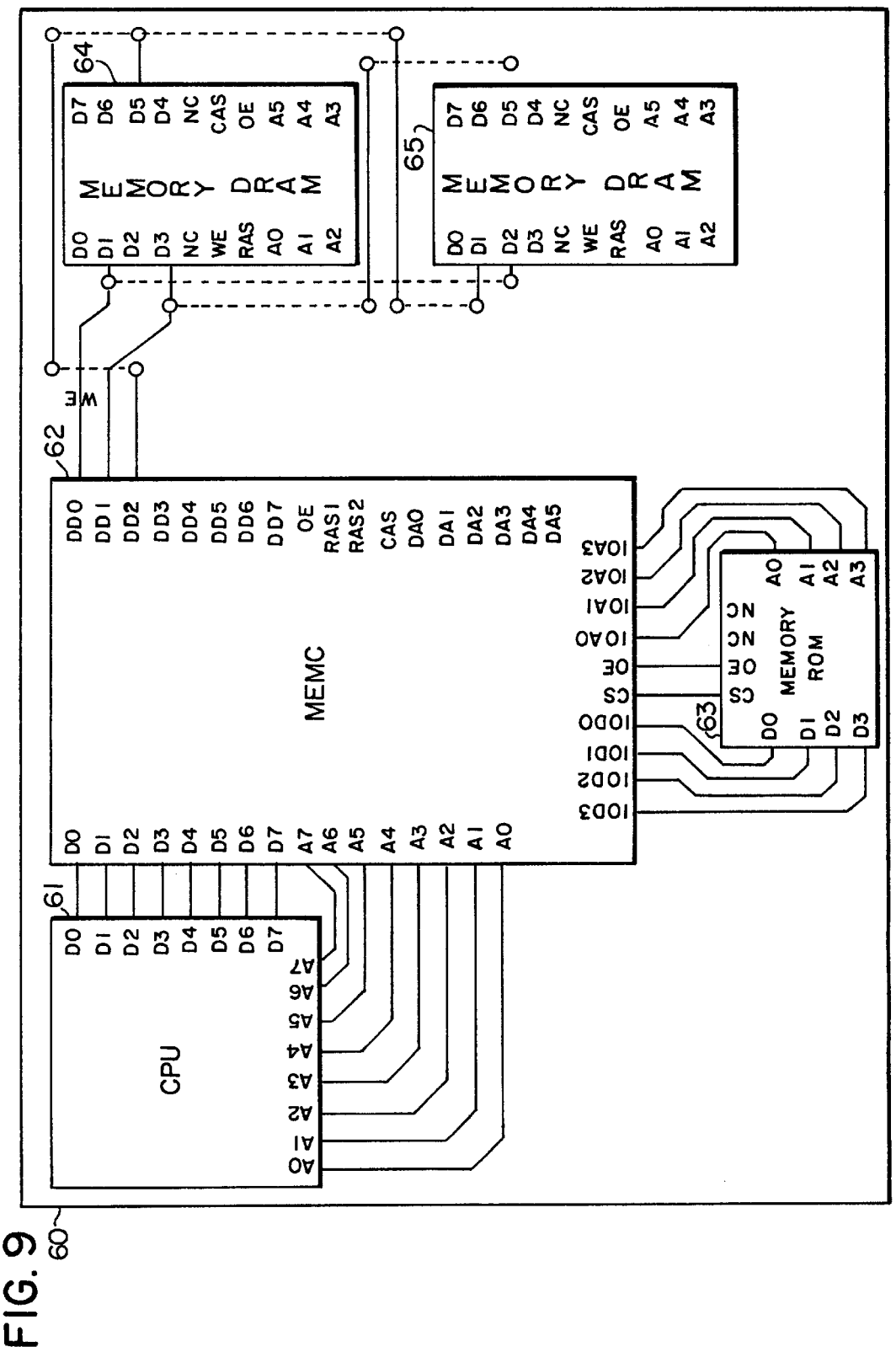
FIG. 9 shows an example of a printed circuit board for which the wiring design apparatus is to be used.

The following is a description of the operation of the wiring design apparatus of the present embodiment described above, when wiring the printed circuit shown in FIG. 9 which is suited to the present apparatus.

The printed circuit board 60 shown in FIG. 9 includes a CPU61, an MEMC 62, and memories 63–65, with, for ease of explanation, the wiring being partially shown after the processing by the wiring changing unit 601 and the wiring unit 602.

The component information and (partial) wiring information for printed circuit board 60, which are inputted from a circuit diagram CAD system, are shown in Table 13 and Table 14, respectively. The component information is information showing the correspondence between component numbers, component names, component types, terminal numbers, and terminal names for all of the components in the circuit. As one example, the component number IC4 in Table 13 has the component name "memory 63", the component type "DRAM", the terminal numbers 1–18, and the corresponding terminal names. The wiring information, on the other hand, is information, for each of the wires in the circuit, showing the signal name, the signal type (data, address, or other), and the terminals of the CPU, the MEMC, and the memories 63–65 to which the wire is connected. As one example, the signal line D0 in Table 14 has the signal line type "data", and is connected to the D0 terminal of CPU 61 and to the D0 terminal of MEMC 62.

In the wiring information obtained from the circuit diagram CAD system, pairs of signal lines connected to adjacent terminals in one of the components are normally also connected to adjacent terminals in other terminals for both the address bus and the data bus. This is because the terminals which form the bus of each component are usually arranged in order of bit numbers.

TABLE 13

| | Component Information | | | |
|---|---|---|---|---|
| Component information | Component name | Component type | Terminal number | Terminal name |
| IC1 | Cpu | Cpu | 1 | D0 |
| | | | ... | ... |
| | | | 100 | A0 |
| IC2 | MEMC | MEMC | 1 | D0 |
| | | | ... | ... |
| | | | 240 | DD0 |
| IC3 | MEMORY 62 | ROM | 1 | D0 |
| | | | ... | ... |
| | | | 16 | CS |
| IC4 | MEMORY 63 | DRAM | 1 | D0 |
| | | | ... | ... |
| | | | 18 | D7 |
| IC5 | MEMORY 64 | DRAM | 1 | D0 |
| | | | ... | ... |
| | | | 18 | D7 |

TABLE 14

| Signal line | Type | CPU | MEMC | Memory 63 | Memory 64 | Memory 65 |
|---|---|---|---|---|---|---|
| D0 | Data | D0 | D0 | — | — | — |
| D1 | Data | D1 | D1 | — | — | — |
| D2 | Data | D2 | D2 | — | — | — |
| ... | ... | ... | ... | ... | ... | ... |
| DA0 | Address | — | DA0 | — | A0 | A0 |
| DA1 | Address | — | DA1 | — | A1 | A1 |
| DA2 | Address | — | DA2 | — | A2 | A2 |
| DA3 | Address | — | DA3 | — | A3 | A3 |
| DA4 | Address | — | DA4 | — | A4 | A4 |
| DA5 | Address | — | DA5 | — | A5 | A5 |
| DD0 | Data | — | DD0 | — | D0 | D0 |
| DD1 | Data | — | DD1 | — | D1 | D1 |
| DD2 | Data | — | DD2 | — | D2 | D2 |
| DD3 | Data | — | DD3 | — | D3 | D3 |
| DD4 | Data | — | DD4 | — | D4 | D4 |
| DD5 | Data | — | DD5 | — | D5 | D5 |
| DD6 | Data | — | DD6 | — | D6 | D6 |
| DD7 | Data | — | DD7 | — | D7 | D7 |

Figure 8A:
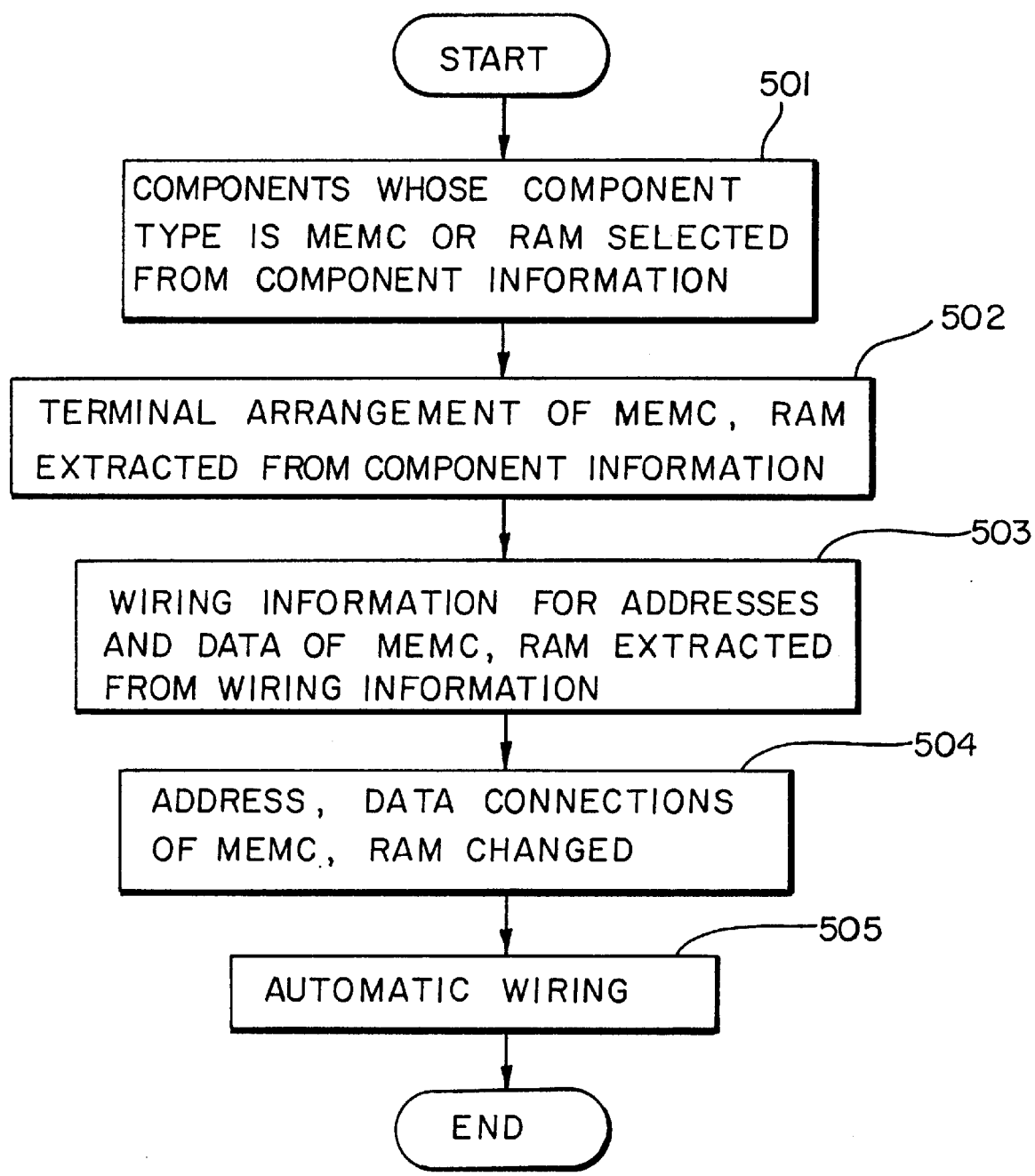
FIG. 8A is a flowchart for the processing performed by the present wiring design apparatus.
Figure 8B:
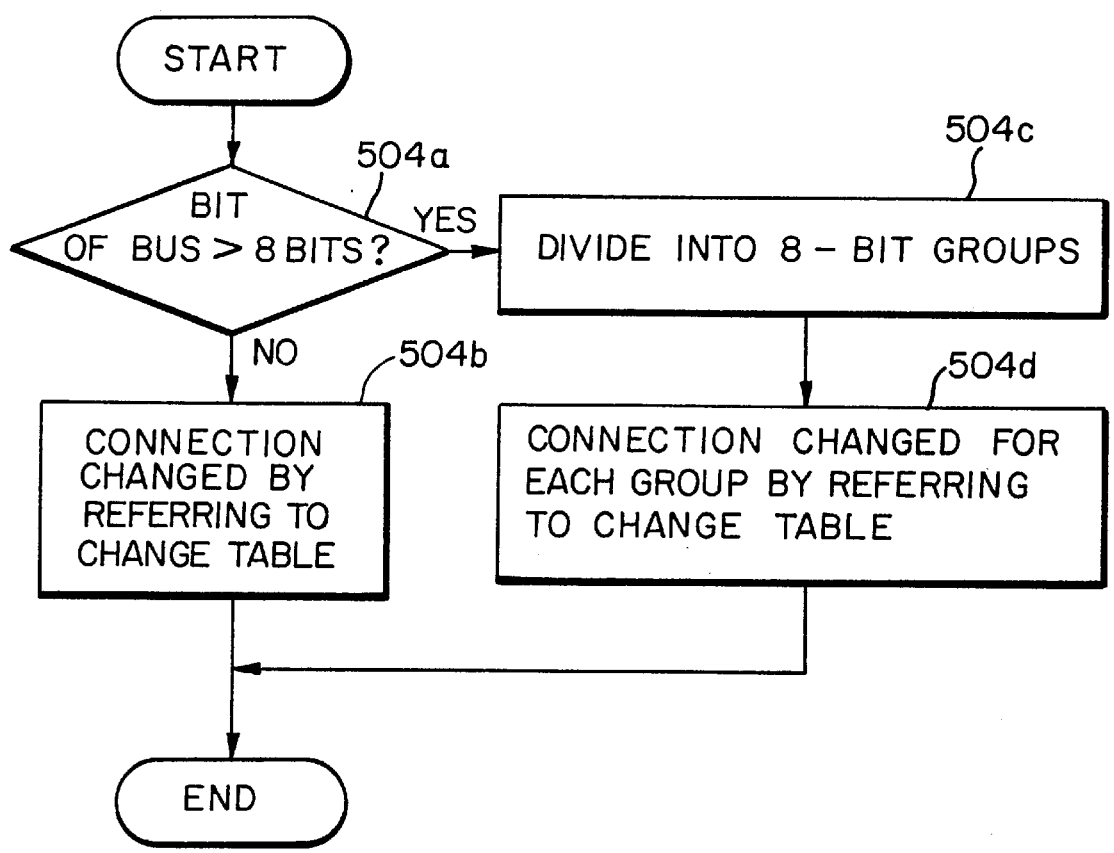
FIG. 8B is a flowchart for the processing when changing the wiring.

FIGS. 8A and 8B are flowcharts for the processing by the present wiring design apparatus. The processing shown in these figures is described below for the specific examples of the component information and the wiring information shown in Table 13 and Table 14.

In FIG. 8A, the wiring changing unit 601 selects the MEMC and RAM (DRAM and SRAM) as the component types from the component information (step 501). For the case with Table 13, this means MEMC 62 and memories 64 and 64 are selected. In this case, memory 63 is not selected since, as a ROM, its terminals cannot be adjusted. Also, for these selected components, the wiring changing unit 601 extracts the terminal arrangement from the component information and the connection pattern of the signal lines in the address bus and the data bus from the wiring information (step 502, 503). Based on the extracted terminal arrangement and connection pattern, the wiring changing unit 601 changes the connection pattern of the data bus and the address bus so that no two signal lines which are connected to adjacent terminals in one component (hereinafter referred to as the base component) are connected to adjacent terminals in any other component (step 504). After this, the wiring unit 602 arranges the wiring on the printed circuit board in accordance with the changed circuit information.

FIG. 8B is a flowchart showing the details for the processing in step 504. For the address bus and data bus extracted in step 503, the wiring changing unit 601 refers to a conversion table showing a terminal interchanging guide when the number of bits for the bus is eight or fewer, sets one component as the base component, and changes the connection pattern for the remaining components (steps 504a, 504b). An example of the conversion table is shown below as Table 15.

TABLE 15

Conversion Table

| Bit number | After Conversion | | | | | | | |
|---|---|---|---|---|---|---|---|---|
| | 4 | 5 | 6 | | 7 | | 8 | |
| 0(8n + 0) | 1 | 1 | 1 | 2 | 1 | 2 | 1 | 2 | 3 |
| 1(8n + 1) | 3 | 4 | 3 | 5 | 3 | 0 | 3 | 7 | 5 |
| 2(8n + 2) | 0 | 2 | 5 | 1 | 6 | 3 | 7 | 4 | 1 |
| 3(8n + 3) | 2 | 0 | 0 | 4 | 0 | 5 | 5 | 1 | 7 |
| 4(8n + 4) | — | 3 | 2 | 0 | 4 | 1 | 2 | 6 | 0 |
| 5(8n + 5) | — | — | 4 | 3 | 2 | 6 | 0 | 3 | 6 |
| 6(8n + 6) | — | — | — | — | 5 | 4 | 4 | 0 | 2 |
| 7(8n + 7) | — | — | — | — | — | — | 6 | 5 | 4 |

In Table 15, the bit numbers in the left column show the bit numbers (the number in brackets showing the order of the terminals in groups when group division has been performed) of the terminals which compose the bus for the component being processed. The "After Conversion" columns show the terminals after conversion expressed as a bit number, for different total numbers of bits. In Table 15, only one example arrangement is given for four- and five-bit buses, while two example arrangements are given for six- and seven-bit buses and three example arrangements are given for eight-bit buses. The present invention is not, however, limited to these arrangements, so that other patterns may be used, provided that no two signal lines connected to adjacent terminals on the base component are connected to adjacent terminals on any other component. Here also, some bus bit numbers are provided with more than one arrangement in readiness with the case when a plurality of components are provided in addition to the base component are provided.

Here, when the data bus and address bus extracted in step 503 have a number of bits which exceeds 8 bits, the wiring unit 602 divides the bus into eight bit groups, refers to the conversion table for each group and changes the connection arrangement for the component being processed (steps 504c, 504d). In Table 14, the wiring unit 602 sets the MEMC 62 as the base component, and memories 64 and 65 as the components to be processed. Here, the connection of the address bus DA[5:0] is changed in accordance with the "number of bits=6" columns of the conversion table, with the arrangement in the left column for "number of bits=6" being used for memory 64 and the arrangement in the right column for "number of bits=6" being used for memory 65. In the same way, the connection of the data bus DD[7:0] is converted in accordance with the "number of bits=8" column of the conversion table, with the arrangement in the left column for "number of bits=8" being used for memory 64 and the arrangement in the center column for "number of bits=8" being used for memory 65.

Table 16 below shows the wiring information which results from the conversion of the wiring information shown in Table 14 in accordance with the conversion table of Table 15.

TABLE 16

| Signal line | Type | CPU | MEMC | Memory 63 | Memory 64 | Memory 65 |
|---|---|---|---|---|---|---|
| D0 | Data | D0 | D0 | — | — | — |
| D1 | Data | D1 | D1 | — | — | — |
| D2 | Data | D2 | D2 | — | — | — |
| ... | ... | ... | ... | ... | ... | ... |
| DA0 | Address | — | DA0 | — | A1 | A2 |
| DA1 | Address | — | DA1 | — | A3 | A5 |
| DA2 | Address | — | DA2 | — | A5 | A1 |
| DA3 | Address | — | DA3 | — | A0 | A4 |
| DA4 | Address | — | DA4 | — | A2 | A0 |
| DA5 | Address | — | DA5 | — | A4 | A3 |
| DD0 | Data | — | DD0 | — | D1 | D2 |
| DD1 | Data | — | DD1 | — | D3 | D7 |
| DD2 | Data | — | DD2 | — | D7 | D4 |
| DD3 | Data | — | DD3 | — | D5 | D1 |
| DD4 | Data | — | DD4 | — | D2 | D6 |
| DD5 | Data | — | DD5 | — | D0 | D3 |
| DD6 | Data | — | DD6 | — | D4 | D0 |
| DD7 | Data | — | DD7 | — | D6 | D5 |

In Table 16, the connection pattern of memories 64 and 65 with the MEMC 62 has been changed. Here, the address and data signal lines between MEMC 62 and memories 64, 65 are changed without changing the signal lines between the CPU 61 and the MEMC 62 or between the MEMC 62 and the memory 63.

The wiring unit 602 arranges the wiring on the printed circuit board in accordance with the converted wiring information and component information. FIG. 9 shows a midway state (complete only as far as the signal line DD2 of MEMC 62) of the wiring by the wiring unit 602. The printed circuit board 60 in FIG. 9 is a multi-level board, with the signal lines show by broken lines and the signal lines shown by solid lines being formed on different levels, with connections between these levels being shown by the white circles "○". As can be seen from FIG. 9, signal lines connected to adjacent terminals of MEMC 62 are connected to non-adjacent terminals in memory 64 and memory 65. By doing so, the memory connection testing procedure of the third embodiment can be used to give a clear indication of the component where a short circuit has occurred.

It should be noted here that in the above example, the component type of memory 63 is ROM, so that its wiring is not rearranged in the present embodiment. This is because it is normal for ROM data to be rewritten outside the printed circuit board. However, the wiring for this ROM may also be rearranged if it is assumed that the data in the ROM is to be rewritten.

The above embodiment gives only one example of a possible rearrangement, so that if every pair of adjacent terminals in each component is connected to different signal lines, there will be no need to rearrange the wiring as shown in FIG. 15.

Sixth Embodiment

Figure 10:
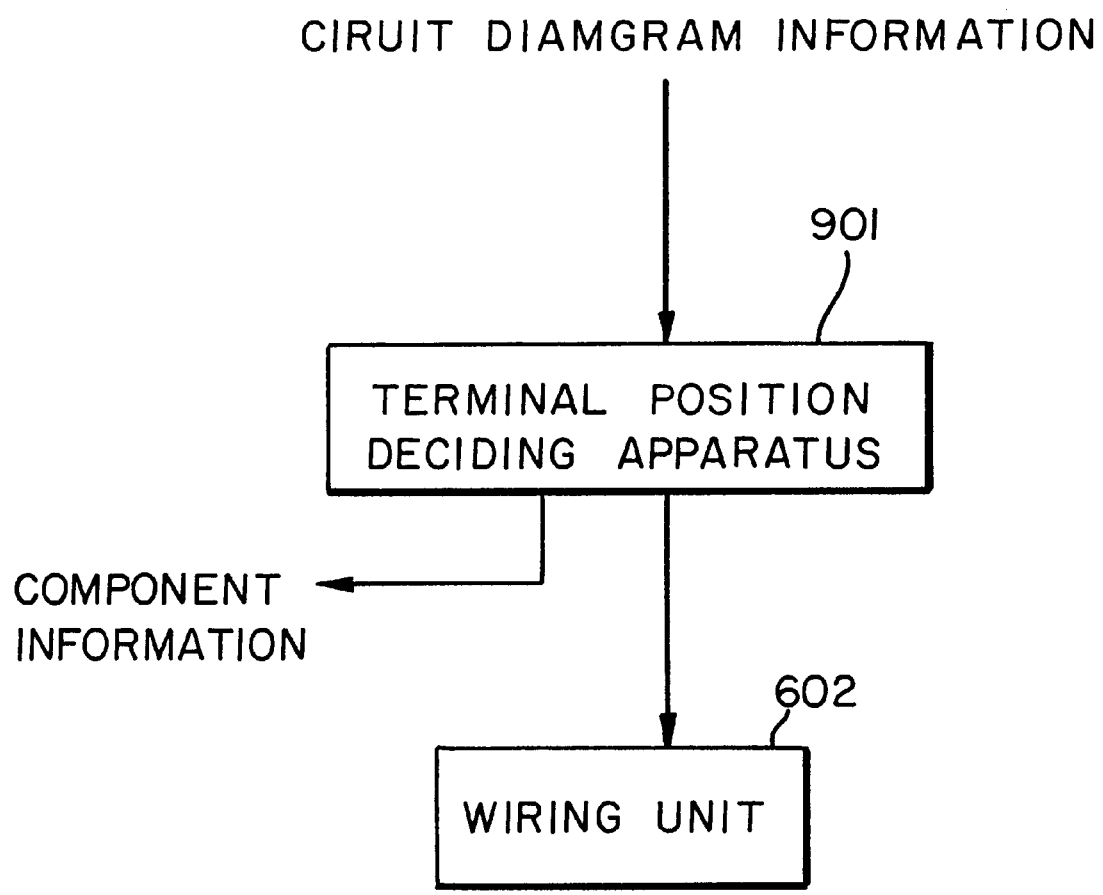
FIG. 10 shows the entire construction of the printed circuit board which includes the terminal position deciding apparatus for the semiconductor chips, according to the sixth embodiment of the present invention.

FIG. 10 shows the entire construction of the printed circuit board setting apparatus, including a terminal position deciding apparatus, of the sixth embodiment of the present invention.

Figure 11:
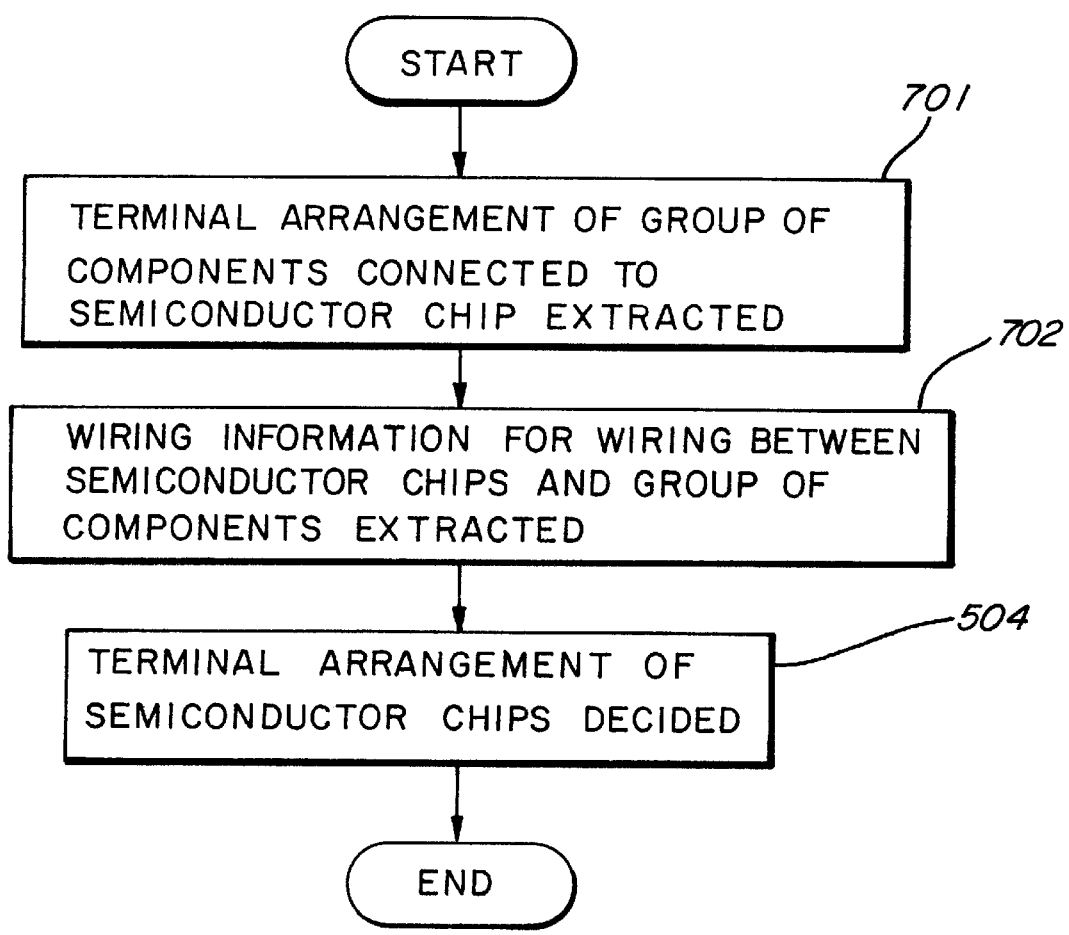
FIG. 11 is a flowchart showing the details of the processing performed by the terminal position deciding apparatus 901.

The printed circuit board setting apparatus shown in FIG. 11 is composed of a terminal position deciding apparatus 901 and a wiring unit 602, with it being possible to use a conventional printed circuit board CAD system as this terminal position deciding apparatus 901. The wiring unit 602 is the same as that shown in FIG. 7 of the fifth embodiment and so will not be described. Instead, the following description will focus on the differences with the fifth embodiment.

The terminal position deciding apparatus 901 changes the layout of the terminals which compose the data bus of a semiconductor chip (component information) of a specific type (here, MEMC), based on the circuit diagram information obtained from a conventional circuit diagram CAD, to a layout which is suited to memory connection testing, before outputting the converted component information to a semiconductor chip production apparatus and the circuit diagram information (wiring information and component information) to the wiring unit 602. More specifically, the terminal position deciding apparatus 901 outputs, as the converted component information, information indicating the pad positions of the data bus signal lines inside a semiconductor chip during the production process of the semiconductor chip. In the same way as the wiring changing unit 601, this terminal position deciding apparatus 901 can be realized by having a CPU 1 of a workstation execute a program which achieves the necessary functions.

FIG. 11 is a flowchart showing the details of the processing performed by the terminal position deciding apparatus 901. Step 504 of this process is the same as that shown in FIGS. 8A and 8B, and so will not be described. Instead, the following explanation will focus on the differences with FIGS. 8A and 8B.

In FIG. 11, the terminal position deciding apparatus 901 extracts the terminal arrangement from the component information and the connection arrangement of the signal lines of the data bus with the other components (memories) from the wiring information, for the component whose component type, extracted from the component information, is MEMC (steps 701, 702). Based on the extracted terminal arrangement and connection arrangement, the terminal position deciding apparatus 901 changes the terminal arrangement of the data bus so that the signal lines connected to any two adjacent terminals are not connected to adjacent terminals of another component (step 504). After this, the wiring unit 602 wires the printed circuit board in accordance with the converted circuit information.

In step 504, the terminal position deciding apparatus 901 treats the MEMC of the present embodiment as either the base component or one of the processed components, as described in the fifth embodiment.

When the terminal arrangement of the MEMC 62 of FIG. 9 is converted by the terminal position deciding apparatus 901 based on the component information shown in Table 13 and the wiring information shown in Table 14, the resulting terminal arrangement is as shown in Table 17 below.

TABLE 17

MEMC

| Terminal number | Terminal name |
|---|---|
| 1 | D0 |
| 2 | D2 |
| 3 | D4 |
| 4 | D6 |
| 5 | D1 |
| 6 | D3 |
| 7 | D5 |
| 8 | D7 |
| . . . | . . . |
| 233 | D1 |
| 234 | D3 |
| 235 | D0 |
| 236 | D2 |
| 237 | D5 |
| 238 | D7 |
| 239 | D4 |
| 240 | D6 |

The wiring unit 602 wires the printed circuit board in accordance with the converted component information of Table 17 and the wiring information. As a result, no pair of signal lines connected to two adjacent terminals of the MEMC with the terminal arrangement of Table 17 is connected to adjacent terminals in any other component.

FIG. 12A shows the terminal positions of a conventional semiconductor chip (which are the same as in the MEMC 62 in FIG. 9). Here, the power supply and ground terminals have not been illustrated. Most conventional chips have this arrangement, where terminal positions are aligned in order of the significance of the signal lines. FIG. 12B, however, shows the terminal positions which are decided by the terminal position deciding apparatus 901 of the present embodiment, which is the semiconductor chip which will be produced by a semiconductor chip production apparatus.

Figure 12C:
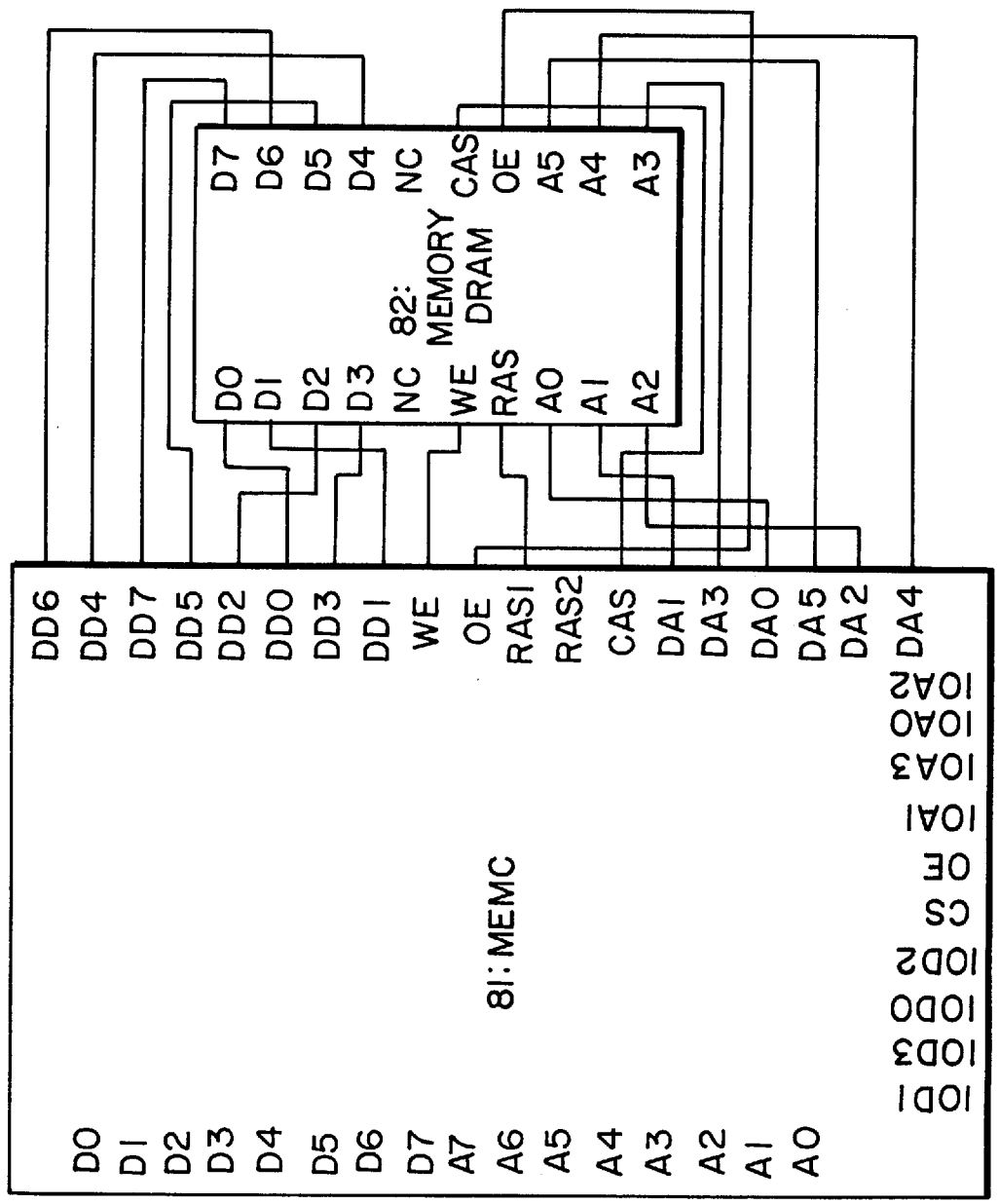
FIG. 12C shows an example of a circuit when a memory chip is connected to the semiconductor chip of FIG. 12B by the wiring unit 602.

FIG. 12C shows an example arrangement when memory is connected to the semiconductor chip shown in FIG. 12B by the wiring unit 602. Here, the effect of the fifth embodiment of the present invention can be achieved not by rearranging the signal lines provided on the printed circuit board, but by interchanging the terminals of the semiconductor chip. This is also a further effect in that it allows a greater amount of freedom for the wiring arrangement of the printed circuit board.

It should be noted here that the present embodiment has a premise that the semiconductor chips are produced by the semiconductor chip production apparatus in accordance with the component information converted by the terminal position deciding apparatus 901. Here, for semiconductor chips such as the MEMC, it is not possible to change the arrangement of terminals for the buses which are connected to ROM or a CPU (when the ROM data is written in outside the device or when the MEMC is programmable), but it is possible to change the arrangement of terminals of the bus which is connected to RAM.

Here, for a data bus between an MEMC and RAM or between RAM chips, when interchangeability is provided, semiconductor chips do not need to be produced by a semiconductor chip production apparatus so long as the terminal names of the chip can be changed. Accordingly, the present invention can be used with commercially available chips.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A memory circuit equipped with a first integrated circuit including a first set of terminals which are connected to a bus and a second integrated circuit including a second set of terminals which are connected to the bus, characterized by having signal lines, which one-to one connect the terminals in the first set of terminals to the terminals in the second set of terminals, arranged so that not a single pair of signal lines connected to adjacent terminals in the first set of terminals is connected to an adjacent pair of terminals in the second set of terminals.

2. The memory circuit of claim 1, wherein each of the sets of terminals is one of a set of terminals connected to a data bus and a set of terminals connected to an address bus, with the first integrated circuit being a memory controller for controlling memory access and the second integrated circuit being a memory chip.

3. The memory circuit of claim 2, wherein a set of terminals connected to a data bus is classified into groups which each comprise a plurality of terminals, with the signal lines being arranged to connect terminals in corresponding groups out of the sets of terminals.

4. A memory circuit including a plurality of integrated circuits which are each equipped with at least one of set of address terminals and a set of data terminals, characterized in that at least one of a set of signal lines, which form an address bus connecting sets of address terminals, and a set of signal lines, which form a data bus connecting sets of data terminals, is arranged so that not a single pair of signal lines connecting two adjacent terminals in any set of terminals is connected to adjacent terminals in another set of terminals.

5. A method for testing a memory circuit for a short circuit between terminals, the memory circuit being a memory circuit which includes a plurality of integrated circuits that are each equipped with at least one of set of address terminals and a set of data terminals, with at least one of a set of signal lines, which form an address bus connecting sets of address terminals, and a set of signal lines, which form a data bus connecting sets of data terminals, being arranged so that not a single pair of signal lines connecting two adjacent terminals in any set of terminals is connected to adjacent terminals in another set of terminals, the method comprising:

a selecting step for selecting one bit out of the address bus as a tested bit;

a generating step for generating a first address which sets a logical value of the tested bit at 0 or 1, and a logical value of all remaining bits in the address bus at an inverse value to the logical value of the tested bit;

a first writing step for writing predetermined data into an address where each bit is set at the inverse value to the logical value of the tested bit;

a second writing step for writing data, which differs from the predetermined data, into the first address;

a reading step for reading data from the address where each bit is set at the inverse value to the logical value of the tested bit;

a comparing step for comparing the data read in the reading step with the predetermined data;

a determining step for determining that a short circuit has occurred between a terminal corresponding to the tested bit and an adjacent terminal when the data compared in the comparing step does not match, and for determining that no short circuit has occurred when the data compared in the comparing step matches; and a reexecuting step for selecting a new bit, out of bits in the address bus which are yet to be tested, as the tested bit, and for having the generating step reexecuted.

6. A method for testing a memory circuit for a short circuit between terminals, the memory circuit being a memory circuit equipped with a first integrated circuit including a first set of terminals that are connected to a bus and a second integrated circuit including a second set of terminals which are connected to the bus, characterized by having signal lines, which one-to one connect the terminals in the first set of terminals to the terminals in the second set of terminals, arranged so that not a single pair of signal lines connected to adjacent terminals in the first set of terminals is connected to an adjacent pair or terminals in the second set of terminals, each of the sets of terminals being a set of terminals connected to a data bus, the first integrated circuit being a memory controller for controlling memory access, and the second integrated circuit being a memory chip, a set of terminals connected to a data bus being classified into groups which each comprise a plurality of terminals, and the signal lines being arranged to connect terminals in corresponding groups out of the sets of terminals, the method comprising:

a selecting step for selecting one bit in each group of the data bus as a tested bit;

a generating step for generating data where each tested bit is set at zero and remaining bits are set at one;

a writing step for writing the data generated in the generating step into a first address;

a comparing step for reading data from the first address and comparing the read data with the data generated in the generating step;

a determining step for determining that a short circuit has occurred between terminals when the data compared in the comparing step does not match; and a reexecuting step for selecting, after the determining step, a new bit in each group, out of bits in the data bus which are yet to be tested, as the tested bit, and for having processing from the generating step to the determining step reexecuted.

7. A wiring design apparatus for wiring a printed circuit board which includes memory chips and a memory control chip for receiving memory access requests from a CPU (Central Processing Unit) and for controlling memory access to the memory chips, the wiring design apparatus comprising:

obtaining means for obtaining circuit diagram information showing a circuit which includes the memory chips and the memory control chip;

first extracting means for extracting, from the obtained circuit diagram information, the memory control chip and any rewritable memory chips as components;

second extracting means for extracting, from the obtained circuit diagram information, terminal positions and terminal interconnections for groups of terminals, in the components extracted by the first extracting means, which are connected to a bus;

changing means for changing the terminal interconnections extracted by the second extracting means so that no signal lines that are connected to adjacent terminals out of a set of terminals belonging to a component extracted by the first extracting means are connected to adjacent signal lines in any other component; and wiring means for wiring the printed circuit board based on the changed terminal interconnections.

8. The wiring design apparatus of claim 7, wherein the changing means includes:

a table for storing a plurality of sets of interchanging data which is data for changing terminal interconnections so that signal lines connected to any two adjacent terminals of a first component are not connected to adjacent terminals in another component; and a changing unit for referring to the table and changing the terminal interconnections between said first component and said other component.

9. A printed circuit board wiring apparatus that changes the terminal positions for a memory control chip which receives memory access requests from a CPU and controls memory access to memory chips, the printed circuit board wiring apparatus comprising:

obtaining means for obtaining circuit diagram information showing a circuit including the memory control chip and the memory chips;

first extracting means for extracting, from the obtained circuit diagram information, the memory control chip and a rewritable memory chip;

second extracting means for extracting, from the obtained circuit diagram information, terminal positions and terminal interconnections for sets of terminals of the memory control chip and of the extracted memory chip;

changing means for changing the terminal positions of the memory control chip so that no two signal lines connected to adjacent terminals out of a set of terminals of the memory control chip are connected to adjacent terminals in the extracted set of terminals of the extracted memory chip; and wiring means for wiring a printed circuit board based on the changed terminal interconnections.

10. The printed circuit board wiring apparatus of claim 9, wherein the changing means includes:

a table for storing a plurality of sets of interchanging data that is data for changing terminal interconnections so that signal lines connected to any two adjacent terminals of a first component are not connected to adjacent terminals in another component; and a changing unit for referring to the table and changing the terminal positions of the set of terminals of the memory control chip.

11. A memory control circuit which is provided as a single chip, which receives memory access requests from a CPU, and controls memory access to a memory chip, the memory control circuit being characterized by including a first set of terminals which supplies an address to the memory chip and a second set of terminals which perform data input and output with the memory chip, and by having the terminals in the first and second sets of terminals arranged so that a difference in CPU bit numbers between terminals in each adjacent pair of terminals in the first and second sets of terminals is not less than two.

12. The memory control circuit of claim 11, wherein each of the first and second sets of terminals is classified into groups which each comprise a plurality of terminals, and wherein the terminals in every group in the sets of terminals are arranged so that a difference in CPU bit numbers between adjacent terminals is not less than two.

13. A circuit having a first integrated circuit, the first integrated circuit comprising a first set of terminals connected to a bus, and a second integrated circuit, the second integrated circuit comprising a second set of terminals connected to the bus, the circuit comprising signal lines connecting the terminals in the first set of terminals to terminals in the second set of terminals, wherein each pair of signal lines that are attached to adjacent terminals in the first set of terminals are attached to non-adjacent terminals in the second set of terminals.

* * * * *